(12) United States Patent
Heo et al.

(10) Patent No.: US 11,360,626 B2
(45) Date of Patent: Jun. 14, 2022

(54) DISPLAY INCLUDING TOUCH-SENSITIVE CIRCUIT AND METHOD FOR OPERATING THE SAME

(71) Applicant: Samsung Electronics Co., Ltd., Gyeonggi-do (KR)

(72) Inventors: Hoondo Heo, Gyeonggi-do (KR); Jaehyung Park, Gyeonggi-do (KR); Sujin Yun, Gyeonggi-do (KR); Sungwon Hong, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/874,348

(22) Filed: May 14, 2020

(65) Prior Publication Data
US 2020/0363907 A1 Nov. 19, 2020

(30) Foreign Application Priority Data
May 14, 2019 (KR) ........................ 10-2019-0056507

(51) Int. Cl.
| | |
|---|---|
| G09G 5/00 | (2006.01) |
| G06F 3/044 | (2006.01) |
| G02F 1/1362 | (2006.01) |
| H01L 25/18 | (2006.01) |
| G02F 1/1333 | (2006.01) |
| G02F 1/1345 | (2006.01) |
| H01L 27/32 | (2006.01) |

(Continued)

(52) U.S. Cl.
CPC .......... *G06F 3/0446* (2019.05); *G02F 1/1368* (2013.01); *G02F 1/13338* (2013.01); *G02F 1/13452* (2013.01); *G02F 1/133514* (2013.01); *G02F 1/136286* (2013.01); *H01L 25/18* (2013.01); *H01L 27/323* (2013.01); *H01L 27/3248* (2013.01); *H01L 27/3276* (2013.01)

(58) Field of Classification Search
CPC ........... G02F 1/13338; G02F 1/133514; G02F 1/13452; G02F 1/136286; G02F 1/1368; G06F 2203/04107; G06F 3/0412; G06F 3/04166; G06F 3/0443; G06F 3/0446; G09G 2310/08; G09G 2354/00; G09G 3/20; H01L 25/18; H01L 27/323; H01L 27/3248; H01L 27/3276
See application file for complete search history.

(56) References Cited

U.S. PATENT DOCUMENTS 5,579,036 A    11/1996  Yates
2013/0342770 A1  12/2013  Kim et al.
(Continued)

*Primary Examiner* — Insa Sadio
(74) *Attorney, Agent, or Firm* — The Farrell Law Firm, P.C.

(57) ABSTRACT

An electronic device include a first substrate; a plurality of thin film transistors (TFTs) disposed on the first substrate and a plurality of pixel electrodes connected to the plurality of TFTs, respectively; a second substrate disposed above the first substrate; a plurality of touch electrodes disposed between the first substrate and the second substrate to detect a touch position; a ground layer disposed under the first substrate; and at least one integrated circuit (IC) configured to apply a touch-driving signal to each of the plurality of touch electrodes during a touch-sensitive period, and apply a driven shield signal having an amplitude that is equal to an amplitude of the touch-driving signal to the ground layer during the touch-sensitive period.

17 Claims, 19 Drawing Sheets

(51) Int. Cl.
    *G02F 1/1368*     (2006.01)
    *G02F 1/1335*     (2006.01)

(56) References Cited

U.S. PATENT DOCUMENTS

| | | |
|---|---|---|
| 2015/0068897 A1 | 3/2015 | Neel et al. |
| 2018/0060637 A1 | 3/2018 | Chao et al. |
| 2018/0203569 A1* | 7/2018 | Ding ................. G02F 1/136286 |
| 2018/0292930 A1* | 10/2018 | Lee ....................... G06F 3/0445 |
| 2018/0348922 A1* | 12/2018 | Luo ..................... G06F 3/04184 |

* cited by examiner

DISPLAY INCLUDING TOUCH-SENSITIVE CIRCUIT AND METHOD FOR OPERATING THE SAME

CROSS-REFERENCE TO RELATED APPLICATION(S)

This application is based on and claims priority under 35 U.S.C. § 119 to Korean Patent Application No. 10-2019-0056507, filed on May 14, 2019, in the Korean Intellectual Property Office, the disclosure of which is incorporated by reference herein in its entirety.

BACKGROUND

1. Field

The disclosure relates generally to a display including a touch sensitive circuit and a method of operating the same.

2. Description of Related Art

Electronic devices (e.g., smart phones and tablet personal computers (PCs)) including a touch screen have been and are being widely distributed. The touch screen may be generally implemented with a display capable of displaying a screen, and a touch-sensitive circuit (e.g., a plurality of electrodes and touch sensor integrated circuits (ICs)) disposed to correspond to the position of the display. The display may be implemented in a liquid crystal display (LCD) type or an organic light-emitting diode (OLED) type, and may be manufactured as a single package (e.g., a display panel). An electronic device including a touch screen is manufactured by attaching a touch-sensitive circuit to a display panel (e.g., an add-on type of display panel). Depending on a component to which the touch-sensitive circuit adheres, the add-on type of display panel may be classified into a glass adhesion type (e.g., a G2 (one glass solution (OGS)) type, a GG (single sided indium tin oxide (SITO)) type, or a GG (double sided indium tin oxide (DITO)) type) of display panel or a film adhesion type (e.g., a GFF type, a G1Ftype, or a GF2(DITO) type) of display panel.

In order to alleviate the problem of increasing the thickness and weight of the entire device by attaching a touch-sensitive circuit to a display panel (e.g., an add-on type), an integrated type of display panel in which a touch-sensitive circuit is included in a display panel has been proposed. A type of display panel in which a plurality of electrodes of a touch-sensitive circuit are disposed on a support substrate (e.g., a backside glass) of the display panel may be referred to as an in-cell type of display panel. A type of display panel in which a plurality of electrodes of a touch-sensitive circuit are disposed on an uppermost substrate (e.g., a color filer glass or an encapsulation glass) of a display panel may be referred to as an on-cell type of display panel.

The integrated type (e.g., the on-cell type or the in-cell type) of display panel may have a small thickness compared to the add-on type of display panel. This is because, compared to the add-on type of display panel, which requires an additional structure layer for supporting the touch electrodes, in the integrated type of display panel, the touch electrodes can be disposed on an existing display substrate. In addition, in the in-cell type of display panel, a common electrode (or a common voltage line) for supplying a potential to a pixel electrode of a display may also be used as an electrode for touch detection, which may enable further reduction of thickness and weight.

SUMMARY

The present disclosure has been made to address the above-mentioned problems and disadvantages, and to provide at least the advantages described below.

In accordance with an aspect of the present disclosure, an electronic device is provided that includes a first substrate; a plurality of thin film transistors (TFTs) disposed on the first substrate and a plurality of pixel electrodes connected to the plurality of TFTs, respectively; a second substrate disposed above the first substrate; a plurality of touch electrodes disposed between the first substrate and the second substrate and configured to detect a touch position; a ground layer disposed under the first substrate; and at least one integrated circuit (IC). The at least one IC is configured to apply a touch-driving signal to each of the plurality of touch electrodes during a touch-sensitive period, and apply a driven shield signal having an amplitude equal to an amplitude of the touch-driving signal to the ground layer during the touch-sensitive period.

In accordance with another aspect of the present disclosure, the electronic device includes a first substrate and a display layer disposed on the first substrate. The display layer includes a plurality of TFTs, a plurality of pixel electrodes connected to the plurality of TFTs, respectively, and a plurality of common electrodes configured to apply a corresponding common voltage to each of the plurality of pixel electrodes. The electronic device further includes a second substrate disposed on the display layer, a plurality of touch electrodes disposed on the second substrate for detecting a touch position, and at least one IC. The at least one IC is configured to apply a touch-driving signal to each of the plurality of touch electrodes during a touch-sensitive period, and apply a driven shield signal having an amplitude equal to an amplitude of the touch-driving signal to at least some of the plurality of common electrodes on the first substrate during the touch-sensitive period.

According to another aspect of the present disclosure, an electronic device includes a first substrate; a second substrate; a display layer disposed between the first substrate and the second substrate; a plurality of touch electrodes disposed between the first substrate and the second substrate or on the second substrate; a back light unit (BLU) disposed under the first substrate configured to emit light; and at least one IC. The at least one IC is configured to apply a touch-driving signal to each of the plurality of touch electrodes during a touch-sensitive period, and apply a driven shield signal having an amplitude that is equal to an amplitude of the touch-driving signal to the BLU during the touch-sensitive period.

According to another aspect of the present disclosure, an electronic device includes a first substrate; a second substrate; a display layer disposed between the first substrate and the second substrate; a plurality of touch electrodes disposed between the first substrate and the second substrate or on the second substrate; a BLU disposed under the first substrate and configured to emit light; a bracket configured to accommodate at least a portion of the BLU; and at least one IC. The at least one IC may be configured to apply a touch-driving signal to each of the plurality of touch electrodes during a touch-sensitive period, and apply a driven shield signal having an amplitude that is equal to an amplitude of the touch-driving signal to the bracket during the touch-sensitive period.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Various embodiments may provide an electronic device and a method of operating the same in which touch sensitivity increases by applying a driven shield signal to a ground layer or a common voltage line (or a common electrode) disposed on the rear surface of a support substrate glass without introducing a separate layer. Accordingly, it is possible to remove an unnecessary parasitic capacitance, which may be generated by a gap between a touch electrode and other components, thereby increasing touch sensitivity.

An electronic device including a touch screen may provide a hovering function. The hovering function may mean a function of identifying the position of a stylus pen or a finger and transmitting the position to an application processor (AP) even if there is no direct contact of the stylus pen or the finger with a cover window (or a cover glass) when the stylus pen or the finger approaches within a predetermined distance of the cover window. When there is no direct contact of the stylus pen or the finger with the cover window, the magnitude of a signal for detection (e.g., an amount of capacitance change) is relatively small, and the hovering function is provided by an add-on type display rather than by an integrated type display. For example, a separate layer may be required in order to suppress unnecessary noise while increasing the magnitude of a signal for detection, which is difficult to implement in an integrated type display.

Figure 1:
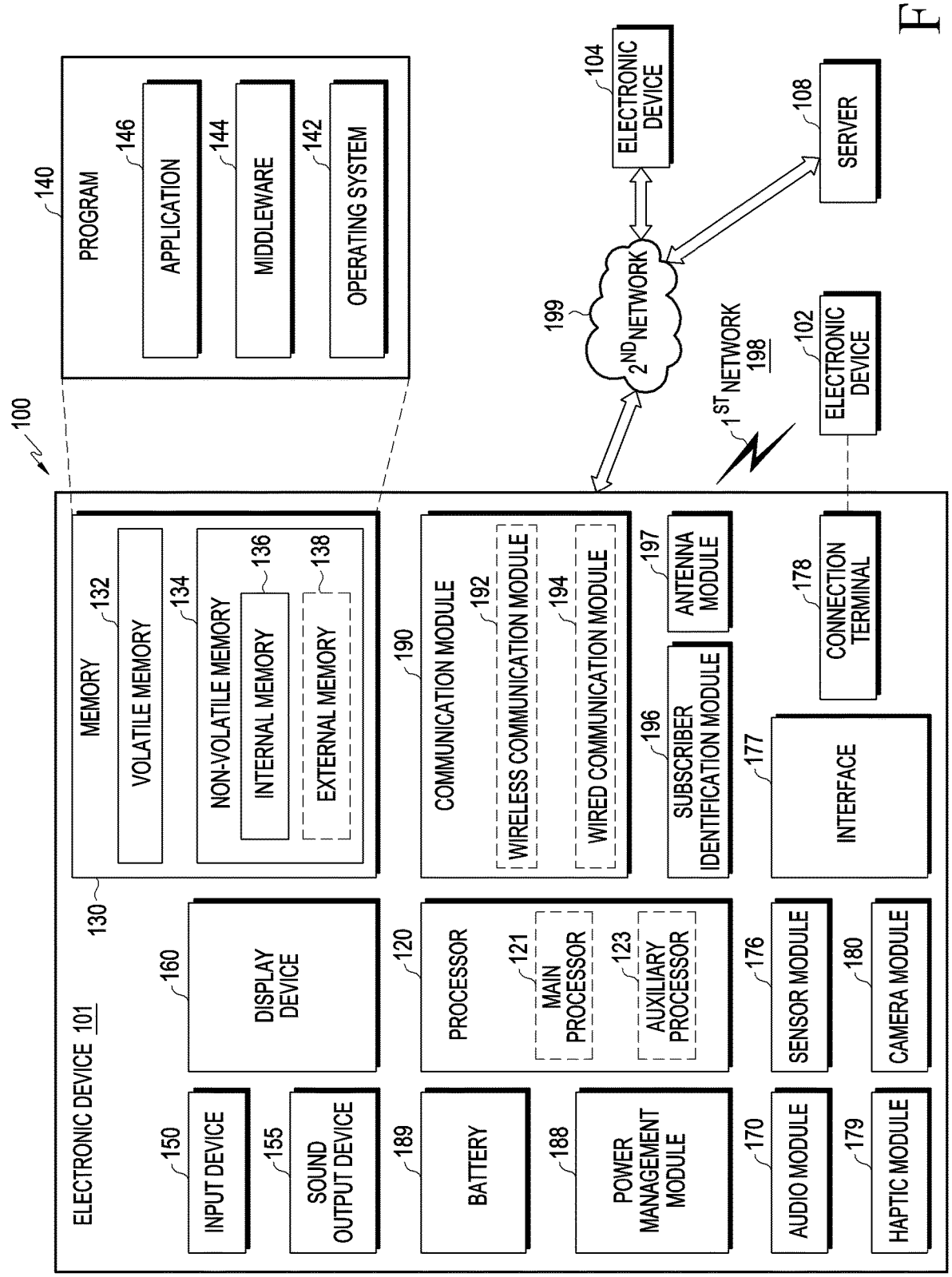
FIG. 1 is a block diagram illustrating an electronic device in a network environment, according to an embodiment.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an AP), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, ISPs, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
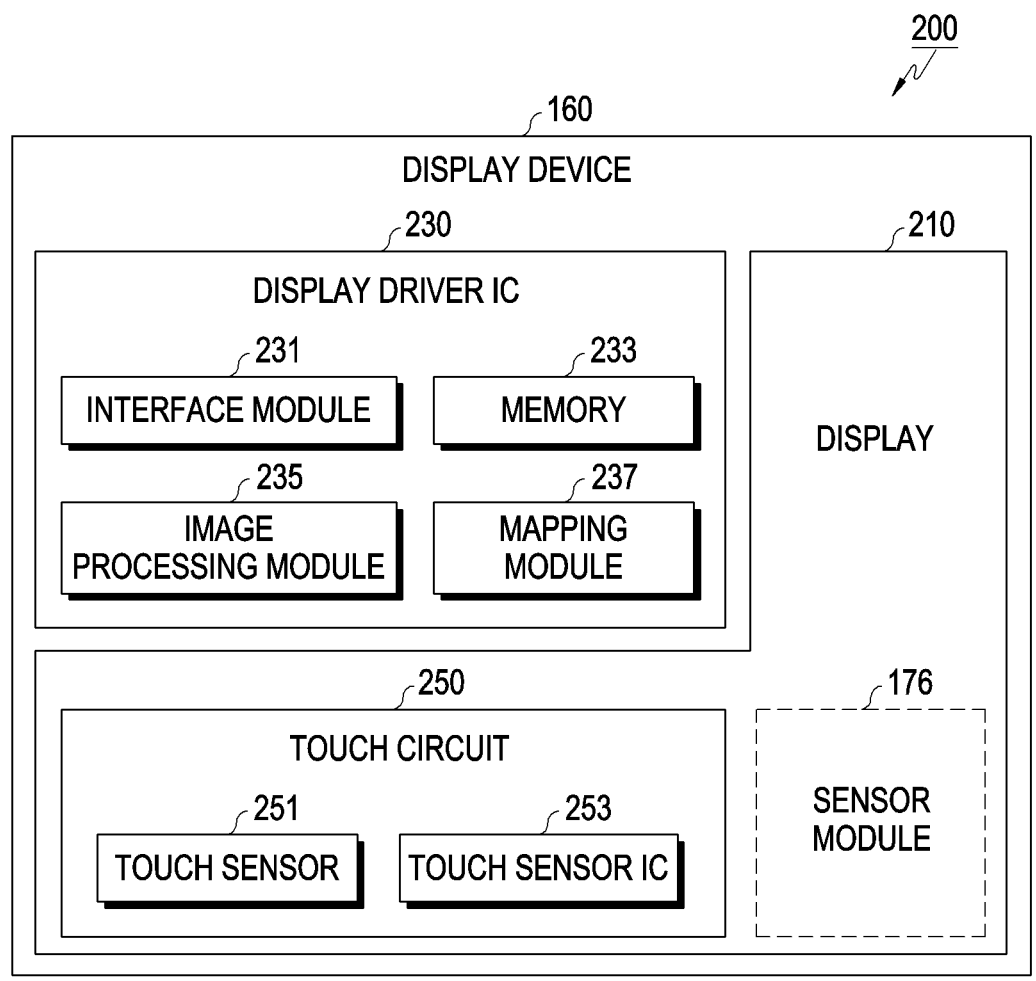
FIG. 2 is a block diagram illustrating the display device, according to an embodiment.

FIG. 2 is a block diagram 200 illustrating the display device 160 according to various embodiments. Referring to FIG. 2, the display device 160 may include a display 210 and a display driver integrated circuit (DDI) 230 to control the display 210. The DDI 230 may include an interface module 231, memory 233 (e.g., buffer memory), an image processing module 235, or a mapping module 237. The DDI 230 may receive image information that contains image data or an image control signal corresponding to a command to control the image data from another component of the electronic device 101 via the interface module 231. For example, according to an embodiment, the image information may be received from the processor 120 (e.g., the main processor 121 (e.g., an AP)) or the auxiliary processor 123 (e.g., a GPU) operated independently from the function of the main processor 121. The DDI 230 may communicate, for example, with touch circuitry 150 or the sensor module 176 via the interface module 231. The DDI 230 may also store at least part of the received image information in the memory 233, for example, on a frame by frame basis. The image processing module 235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 210. The mapping module 237 may generate a voltage value or a current value corresponding to the image data pre-processed or post-processed by the image processing module 235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 210 may be driven, for example, based at least in part on the voltage value or the current value such that visual information (e.g., a text, an image, or an icon) corresponding to the image data may be displayed via the display 210.

According to an embodiment, the display device 160 may further include the touch circuitry 250. The touch circuitry 250 may include a touch sensor 251 and a touch sensor IC 253 to control the touch sensor 251. The touch sensor IC 253 may control the touch sensor 251 to sense a touch input or a hovering input with respect to a certain position on the display 210. To achieve this, for example, the touch sensor 251 may detect (e.g., measure) a change in a signal (e.g., a voltage, a quantity of light, a resistance, or a quantity of one or more electric charges) corresponding to the certain position on the display 210. The touch circuitry 250 may provide input information (e.g., a position, an area, a pressure, or a time) indicative of the touch input or the hovering input detected via the touch sensor 251 to the processor 120. According to an embodiment, at least part (e.g., the touch sensor IC 253) of the touch circuitry 250 may be formed as part of the display 210 or the DDI 230, or as part of another component (e.g., the auxiliary processor 123) disposed outside the display device 160.

According to an embodiment, the display device 160 may further include at least one sensor (e.g., a fingerprint sensor, an iris sensor, a pressure sensor, or an illuminance sensor) of the sensor module 176 or a control circuit for the at least one sensor. In such a case, the at least one sensor or the control circuit for the at least one sensor may be embedded in one portion of a component (e.g., the display 210, the DDI 230, or the touch circuitry 150)) of the display device 160. For example, when the sensor module 176 embedded in the display device 160 includes a biometric sensor (e.g., a fingerprint sensor), the biometric sensor may obtain biometric information (e.g., a fingerprint image) corresponding to a touch input received via a portion of the display 210. As another example, when the sensor module 176 embedded in the display device 160 includes a pressure sensor, the pressure sensor may obtain pressure information corresponding to a touch input received via a partial or whole area of the display 210. According to an embodiment, the touch sensor 251 or the sensor module 176 may be disposed between pixels in a pixel layer of the display 210, or over or under the pixel layer.

Figure 3:
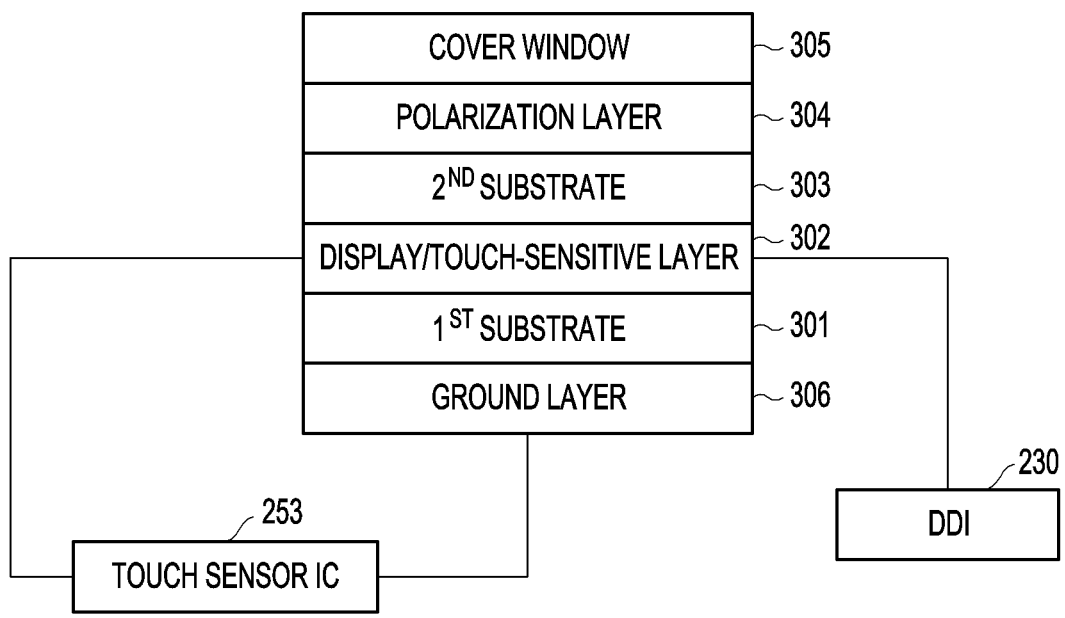
FIG. 3 is a diagram illustrating a stacked structure and an electrical connection relationship of a touch screen of an electronic device, according to an embodiment.

FIG. 3 is a diagram illustrating a stacked structure and an electrical connection relationship of a touch screen of an electronic device, according to an embodiment.

FIG. 3 illustrates a stacked structure and an electrical connection relationship of an in-cell type touch screen disposed between a first substrate 301 and a second substrate 303. A display/touch-sensitive layer 302 may be disposed on a first surface of the first substrate 301. The first substrate 301 and the second substrate 303 may be made of glass or a polymer, but are not limited to these materials. The display/touch-sensitive layer 302 may include at least one element for screen display and at least one element for touch detection. For example, a signal line (e.g., a gate line or a data line) to which a display-driving signal (e.g., a gate signal or a data signal) can be applied may be disposed on the display/touch-sensitive layer 302. The display/touch sensitive layer 302 may include a plurality of TFTs, each of which is connected to the signal line and each of a plurality of pixel electrodes. Since the plurality of TFTs may be disposed on the first substrate 301, when the first substrate 301 is made of glass, the first substrate may be referred to as TFT glass. The display driver IC (DDI) 230 may apply various signals (e.g., a synchronization signal, an analog signal for screen display, and a common voltage signal) to elements for display of the display/touch-sensitive layer 302. The DDI 230 may provide at least one synchronization signal to the touch sensor IC 253, and the touch sensor IC 253 may apply a touch-driving signal in a touch-sensing period using the received synchronization signal. The touch sensor IC 253 may be implemented using a DDI 230 and a single IC, and may thus be referred to as a touch-and-display driver IC (TDDI).

A plurality of touch electrodes may be disposed on the display/touch-sensitive layer 302. A touch-sensitive scheme may be, for example, a self-capacitance scheme, and a plurality of touch electrodes according to the self-capacitance scheme may be included in the display/touch-sensitive layer 302. The touch electrodes may be used as electrodes for detecting a touch position in the touch-sensing period, and may be used as common electrodes in the display period. The touch electrodes may be used only for the purpose of touch detection, in which case the display/touch-sensitive layer 302 may include a common electrode for display (or a common voltage line to which a common voltage is applied). A more detailed positional relationship between respective elements will be described in more detail below with reference to FIGS. 4A, 4B, and 4C. The touch sensor IC 253 may apply a touch-driving signal to the touch electrodes during the touch-sensing period, and may identify a touch position based on information measured thereby (e.g., a capacitance change of the touch electrodes). The touch sensor IC 253 may transmit the touch position to an AP. The touch sensor IC 253 may check various information including a touch type as well as the touch position.

A ground layer 306 may be disposed on a second surface (e.g., the rear surface) opposite the first surface of the first substrate 301. The ground layer 306 may be made of, for example, ITO, but is not limited thereto as long as it is made of a conductive transparent (or substantially transparent) material. Here, the term "substantially transparent material" may mean a material having a light transmittance higher than a preset standard.

The display 306 may be electrically connected to the touch sensor IC 253. For example, in the touch-sensing period, the touch sensor IC 253 may apply a voltage having the same magnitude as the touch-driving signal to the ground layer 306. In the touch-sensing period, the touch sensor IC 253 may apply a signal, which is the same as the touch-driving signal in at least one of frequency, phase, and voltage values, to the ground layer 306. In the display period, the touch sensor IC 253 may perform control such that a ground voltage (e.g., substantially 0 V) is applied to the ground layer 306. The touch sensor IC 253 may operate such that a ground voltage is applied to, for example, the ground layer 306, or may be configured such that a special operation is not performed. FIG. 3 illustrates that the length of one side of the ground layer 306 is substantially the same as the length of one side of the first substrate 301. However, the length of one side of the ground layer 306 may be set to be less than or equal to the length of one side of the first substrate 301, or may be larger than the length of one side of the first substrate 301.

The display/touch-sensitive layer 302 may include a liquid crystal layer, and the liquid crystals in the liquid crystal layer may be changed in orientation based on a voltage applied to each of the pixel electrodes based on a signal provided through a data line. The second substrate 303 may be disposed on the display/touch-sensitive layer 302, and may store, for example, a liquid crystal layer. When the display of the electronic device 101 is of an LCD type of display, a color filter may be disposed on the second substrate 303, and when the second substrate 303 is made of glass, it may be referred to as a "color filter glass". In this case, a polarization plate and a BLU may be additionally disposed under the first substrate 301. When the display of the electronic device 101 is of an OLED type of display, it is not necessary to dispose a separate color filter on the second substrate 303. When the second substrate 303 is made of glass, it may be referred to as an "encapsulation glass" and when the second substrate 303 is made of a polymer, it may be referred to as a thin film encapsulation (TFE). A polarization layer 304 may be disposed on the second substrate 303, and a cover window 305 may be disposed on the polarization layer 304.

Figure 4A:
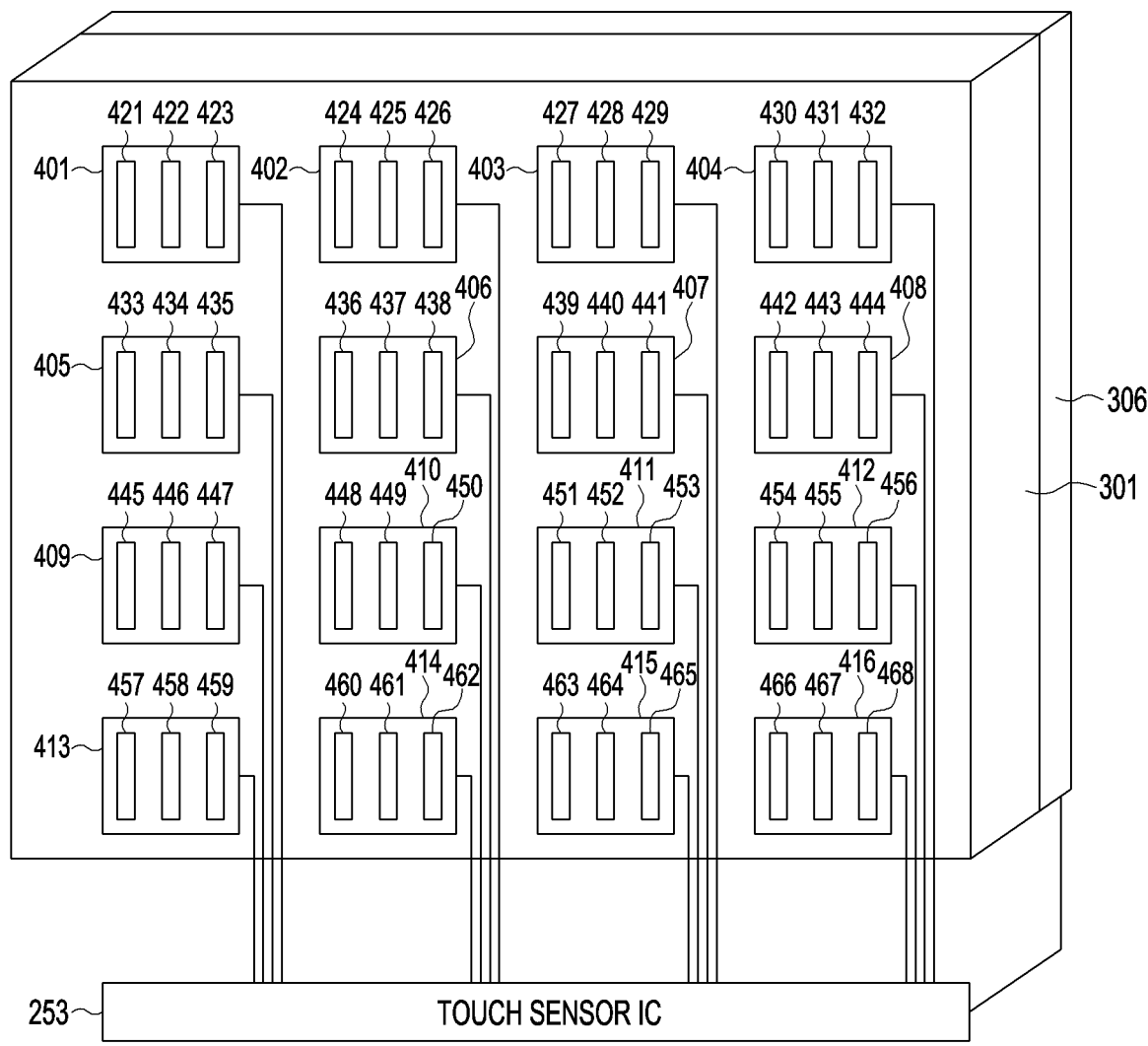
FIG. 4A is a diagram illustrating a layout of touch electrodes, pixel electrodes, and a ground layer, according to an embodiment.

FIG. 4A is a diagram illustrating a layout of touch electrodes, pixel electrodes, and a ground layer, according to an embodiment.

Referring to FIG. 4A, a plurality of touch electrodes including a first touch electrode 401, a second touch electrode 402, a third touch electrode 403, a fourth touch electrode 404, a fifth touch electrode 405, a sixth touch electrode 406, a seventh touch electrode 407, an eighth touch electrode 408, a ninth touch electrode 409, a tenth touch electrode 410, an eleventh touch electrode 411, a twelfth touch electrode 412, a thirteenth touch electrode 413, a fourteenth touch electrode 414, a fifteenth touch electrode 415, and a sixteenth touch electrode 416 are disposed on the first substrate 301. On the first substrate 301, a plurality of pixel electrodes including a first pixel electrode 421, a second pixel electrode 422, a third pixel electrode 423, a fourth pixel electrode 424, a fifth pixel electrode 425, a sixth pixel electrode 426, a seventh pixel electrode 427, an eighth pixel electrode 428, a ninth pixel electrode 429, a tenth pixel electrode 430, an eleventh pixel electrode 431, a twelfth pixel electrode 432, a thirteenth pixel electrode 433, a fourteenth pixel electrode 434, a fifteenth pixel electrode 435, a sixteenth pixel electrode 436, a seventeenth pixel electrode 437, an eighteenth pixel electrode 438, a nineteenth pixel electrode 439, a twentieth pixel electrode 440, a twenty-first pixel electrode 441, a twenty-second pixel electrode 442, a twenty-third pixel electrode 443, a twentyfourth pixel electrode 444, a twenty-fifth pixel electrode 445, a twenty-sixth pixel electrode 446, a twenty-seventh pixel electrode 447, a twenty-eighth pixel electrode 448, a twenty-ninth pixel electrode 449, a thirtieth pixel electrode 450, a thirty-first pixel electrode 451, a thirty-second pixel electrode 452, a thirty-third pixel electrode 453, a thirty-fourth pixel electrode 454, a thirty-fifth pixel electrode 455, a thirty-sixth pixel electrode 456, a thirty-seventh pixel electrode 457, a thirty-eighth pixel electrode 458, a thirty-ninth pixel electrode 459, a fortieth pixel electrode 460, a forty-first pixel electrode 461, a forty-second pixel electrode 462, a forty-third pixel electrode 463, a forty-fourth pixel electrode 434, a forty-fifth pixel electrode 465, a forty-sixth pixel electrode 466, a forty-seventh pixel electrode 467, and a forty-eighth pixel electrode 468 are disposed. For example, the first pixel electrode 421, the second pixel electrode 422, and the third pixel electrode 423 may be disposed above or under a region corresponding the first touch electrode 401. It will be readily understood by a person ordinarily skilled in the art that the layout in FIG. 4A may be adapted such that the number of pixel electrodes corresponding to one touch electrode may vary in shapes, sizes, and alignment methods of the touch electrodes and the pixel electrodes The plurality of touch electrodes may be electrically connected to the touch sensor IC 253. In the touch-sensitive section, the touch sensor IC 253 may perform control such that a touch-driving signal is applied to each of the touch electrodes the plurality of touch electrodes. The touch sensor IC 253 may measure an output signal from each of the plurality of touch electrodes while the touch-driving signal is applied. The touch sensor IC 253 may identify the degree of capacitance change of each of the plurality of touch electrodes based on the output signal, and may identify a touch position based on the change. The touch sensor IC 253 may apply a signal, having the same phase and the same amplitude as the touch-driving signal, to the ground layer 306 while the touch-driving signal is applied to each of the plurality of touch electrodes. Alternatively, the touch sensor IC 253 may apply a constant voltage having the same amplitude as the touch-driving signal to the ground layer 306. Accordingly, no parasitic capacitance may be formed between the plurality of touch electrodes and the ground layer 306.

Each of the plurality of touch electrodes may be used as a common electrode in the display period. The plurality of touch electrodes may be connected to the DDI 230. The DDI 230 may apply a common voltage Vcom to each of the plurality of touch electrodes during the display period. The common voltage may be a voltage for the pixel electrodes for image display, and may be applied to one end of a capacitor corresponding to each of for example, the plurality of touch electrodes. Meanwhile, other common electrodes (or common voltage lines) other than the plurality of touch electrodes may be additionally disposed, in which case the plurality of touch electrodes may not be connected to the DDI 230.

Figure 4B:
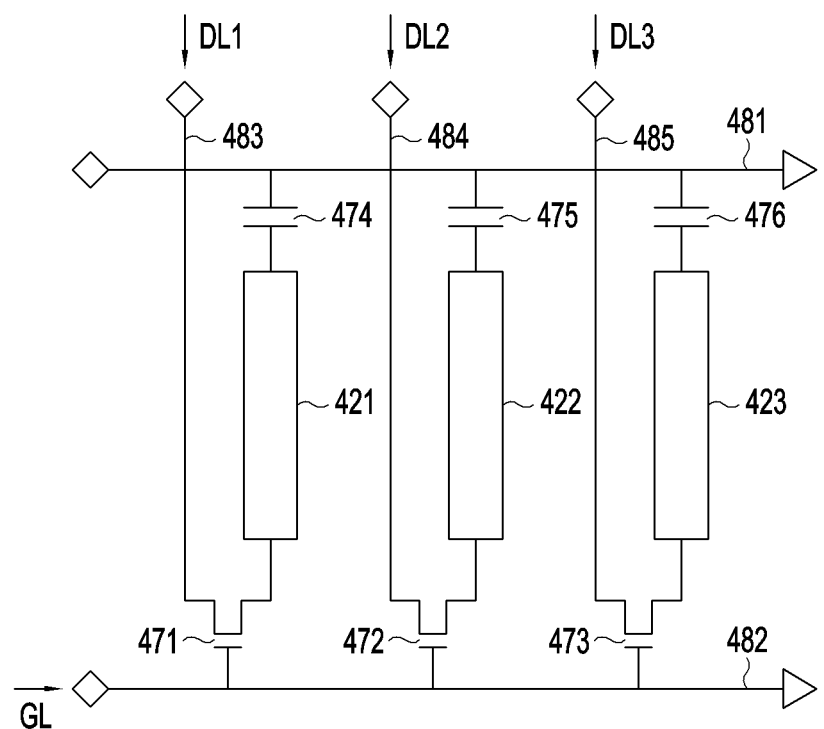
FIG. 4B is a diagram illustrating a connection between signal lines and pixel electrodes, according to an embodiment.

FIG. 4B is a diagram illustrating a connection between signal lines and pixel electrodes, according to an embodiment. A connection relationship of three pixel electrodes is illustrated in FIG. 4B. A first pixel electrode 421 may be connected to the source of a first TFT 471, the gate of the first TFT 471 may be connected to a gate line 482, and the drain of the first TFT 471 may be connected to a first data line 483. A first capacitor 474 may be connected to the first pixel electrode 421, and a signal line 481 may be connected to one end of the first capacitor 474 so that, for example, a common voltage may be applied to one end of the first capacitor 474. A second pixel electrode 422, a second TFT 472, a second data line 484, and a second capacitor 475, and a third pixel electrode 423, a third TFT 473, a third data line 485, and a third capacitor 476 may also have the same connection relationship as the first pixel electrode 421, the first TFT 471, the first data line 483, and the first capacitor 474. A gate line signal GL may be applied to the gate line 482 and a first data line signal DL1, a second data line signal DL2, and a third data line signal DL3 may be applied to the first data line 483, the second data line 484, and the third data line 485, respectively.

Figure 4C:
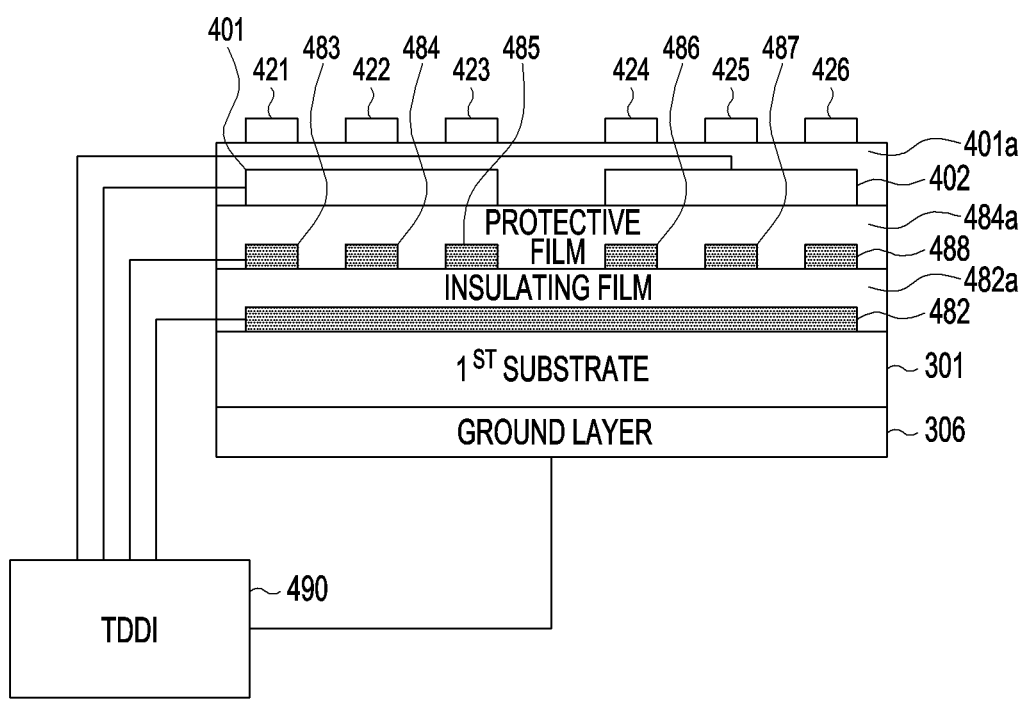
FIG. 4C is a diagram illustrating a stacked structure of a touch screen, according to an embodiment.

FIG. 4C is a diagram illustrating a stacked structure of a touch screen, according to an embodiment.

Referring to FIG. 4C, a gate line 482 is disposed on the first substrate 301, and the gate line 482 may be covered by an insulating film 482a. A plurality of data lines including a first data line 483, a second data line 484, a third data line 485, a fourth data line 486, a fifth data line 487, and a sixth data line 488 may be disposed on an insulating film 482a, and the plurality of data lines may be covered by a protective layer 484a. A first touch electrode 401 and a second touch electrode 402 may be disposed on the protective film 484a, and the first touch electrode 401 and the second touch electrode 402 may be covered by the insulating film 401a. A plurality of pixel electrodes including a first pixel electrode 421, a second pixel electrode 422, a third pixel electrode 423, a fourth pixel electrode 424, a fifth pixel electrode 425, a sixth pixel electrode 426, and a seventh pixel electrode 427 may be disposed on the insulating film 401a. A TTD 490 may be connected to the first touch electrode 401 and the second touch electrode 402. A liquid crystal layer may be disposed on the plurality pixel electrodes.

During the touch-sensitive period, the TDDI 490 may perform control such that a touch-driving signal is applied to each of the first touch electrode 401 and the second touch electrode 402. The TDDI 490 may identify touch information including a touch position based on a signal output from each of the first touch electrode 401 and the second touch electrode 402. For example, the TDDI 490 may identify touch information based on the degree of capacitance change for each of the first touch electrode 401 and the second touch electrode 402. During the touch-sensitive period, the TDDI 490 may apply a driven shield signal having the same phase and the same amplitude as the touch-driving signal to the ground layer 306. During the touch-sensitive period, the TDDI 490 may apply a constant voltage having the same amplitude as the touch-driving signal to the ground layer 306.

During the display period, the TDDI 490 may perform control such that an electrical signal is applied to the gate line 482 and each of the plurality of data lines. The TDDI 490 may perform control such that the ground voltage (e.g., substantially 0 V) is applied to the ground layer 306, or may not perform any other operation. When the first touch electrode 401 and the second touch electrode 402 are used as common electrodes, the DDI 230 may perform control such that a common voltage is applied to the first touch electrode 401 and the second touch electrode 402 during the display period. Meanwhile, the connection relationship between the TDDI 490 and any element in the stacked structure in FIG. 4C indicates that the TDDI 490 is connected to all the elements of the same type including the corresponding element. For example, in FIG. 4C, the TDDI 490 is illustrated as being connected only to the data line 483. However, this is for easy identification of the drawing, and it will be readily understood by a person ordinarily skilled in the art that the TDDI 490 is connectable to each of the plurality of data lines.

The electronic device 101 may be implemented to include the touch sensor IC 253 and the DDI 230 instead of the TDDI 490. In this case, the touch sensor IC 253 may receive at least one synchronization signal from the DDI 230, and may perform control such that a touch-driving signal is applied to the first touch electrode 401 and the second touch electrode 402 during a touch-sensitive period identified based on the synchronization signal. The touch sensor IC 253 may apply a driven shield signal to the ground layer 306 during the touch-sensitive period. The DDI 230 may be configured to apply a driving shield signal to the ground layer 306 during the touch-sensitive period. During the display period, the DDI 230 may apply a TFT gate voltage to the gate line 482 or may apply a signal for screen display to the plurality of data lines. When the first touch electrode 401 and the second touch electrode 402 are also used as common electrodes, the TDDI 490 may perform control such that a common voltage is applied to the first touch electrode 401 and the second touch electrode 402 during the display period. During the display period, the touch sensor IC 253 or the DDI 230 may operate such that a ground voltage is applied to the ground layer 306, or may not perform any other operation.

Figure 5:
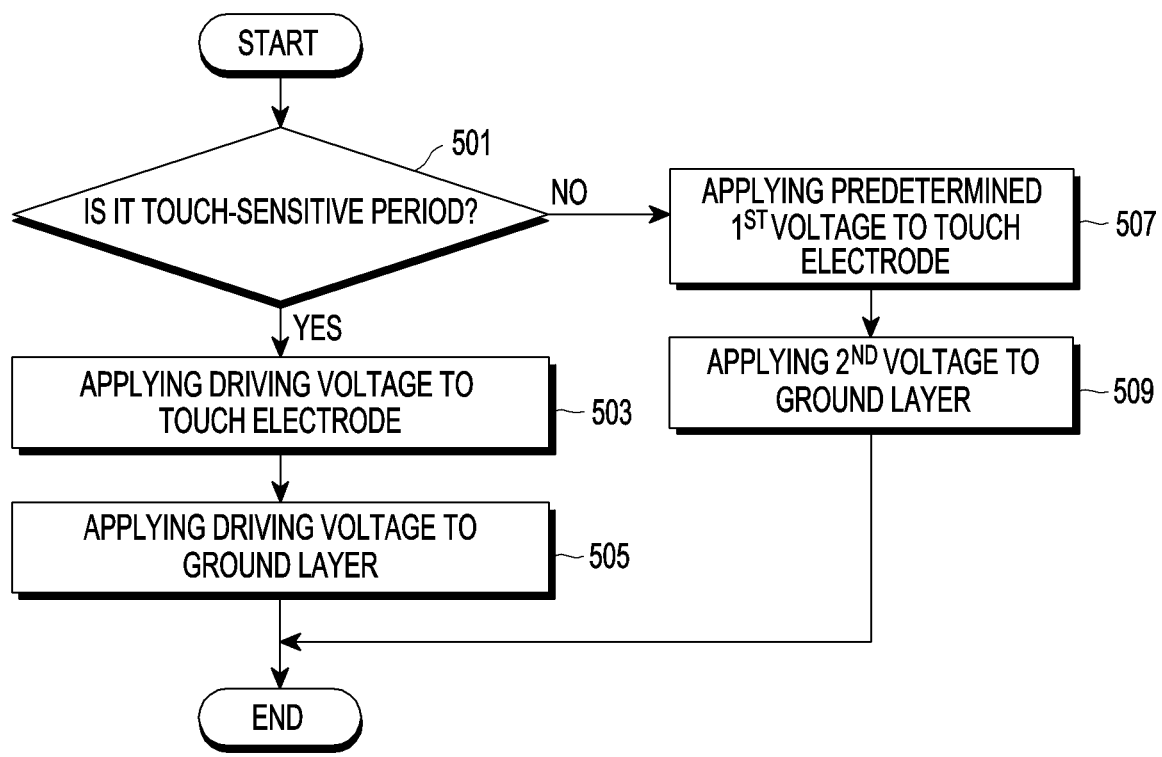
FIG. 5 is a flowchart illustrating a method of operating an electronic device, according to an embodiment.

FIG. 5 is a flowchart illustrating a method of operating an electronic device, according to an embodiment.

Referring to FIG. 5, in step 501, at least one IC (e.g., at least one of the DDI 230 or the touch sensor IC 253) of the electronic device 101 identifies whether a display period is a touch-sensitive period.

In this disclosure, when it is described that the electronic device 101 performs a specific operation, it may mean that at least one IC (e.g., at least one of the DDI 230 or the touch sensor IC 253) may perform the specific operation or the TDDI 490 may perform the specific operation. Alternatively, when it is described that the electronic device 101 performs a specific operation, it may mean that at least one IC (e.g., at least one of the DDI 230 or the touch sensor IC 253) may control another hardware element to perform the specific operation or the TDDI 490 may control another hardware element to perform the specific operation. For example, the touch sensor IC 253 may identify whether a display period is a touch-sensitive period based on a synchronization signal from the DDI 230. For example, the DDI 230 may identify whether the display period is a touch-sensitive period based on a timing signal from a timing controller. The TDDI 490 may identify whether it is a touch-sensitive period based on a timing signal from the timing controller. The touch sensor IC 253 may also receive a timing signal from the timing controller, and may identify whether it is a touch-sensitive period. For example, at least one of the touch sensor IC 253, the DDI 230, or the TDDI 490 may store an algorithm, program, or firmware that sets a touch-sensitive period and a display period based on a timing signal from the timing controller.

When it is identified that the display period is a touch-sensitive period, in step 503, the electronic device 101 applies a driving voltage (e.g., a touch-driving signal) to touch electrodes. In step 505, the electronic device 101 applies a driving voltage to the ground layer 306 positioned on the rear surface of the first substrate 301. The touch sensor IC 253 may identify touch information including a touch position based on an output signal from the touch electrodes. FIG. 5 illustrates that step 505 is performed after step 503 is performed. However, steps 503 and 505 may be performed simultaneously, or step 505 may be performed first. It will be readily understood by a person ordinarily skilled in the art that the steps in the flowcharts of this disclosure do not limit the sequential relationship, and another step may be additionally performed between successively illustrated steps.

In step 507, when it is identified that a display period is not a touch-sensitive period, the electronic device 101 applies a predetermined first voltage to the touch electrodes. For example, when common electrodes are included in the electronic device 101 in addition to the touch electrodes, the electronic device 101 may perform control such that a voltage of substantially 0 V is applied to the touch electrodes. When the touch electrodes are used as common electrodes, the electronic device 101 may perform control such that a common voltage is applied to the touch electrodes. In step 509, the electronic device 101 may perform control such that a predetermined second voltage is applied to the ground layer 306. For example, the electronic device 101 may perform control such that a ground voltage (e.g., substantially 0 V) is applied to the ground layer 306.

Figure 6A:
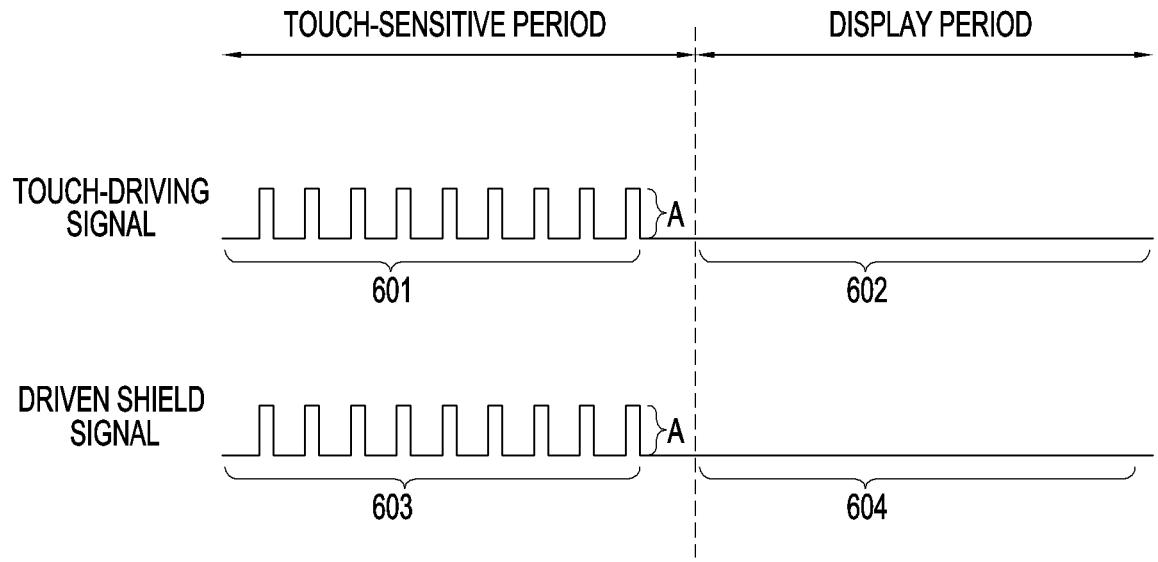
FIG. 6A illustrates a touch-driving signal and a driven shield signal, according to an embodiment.
Figure 6B:
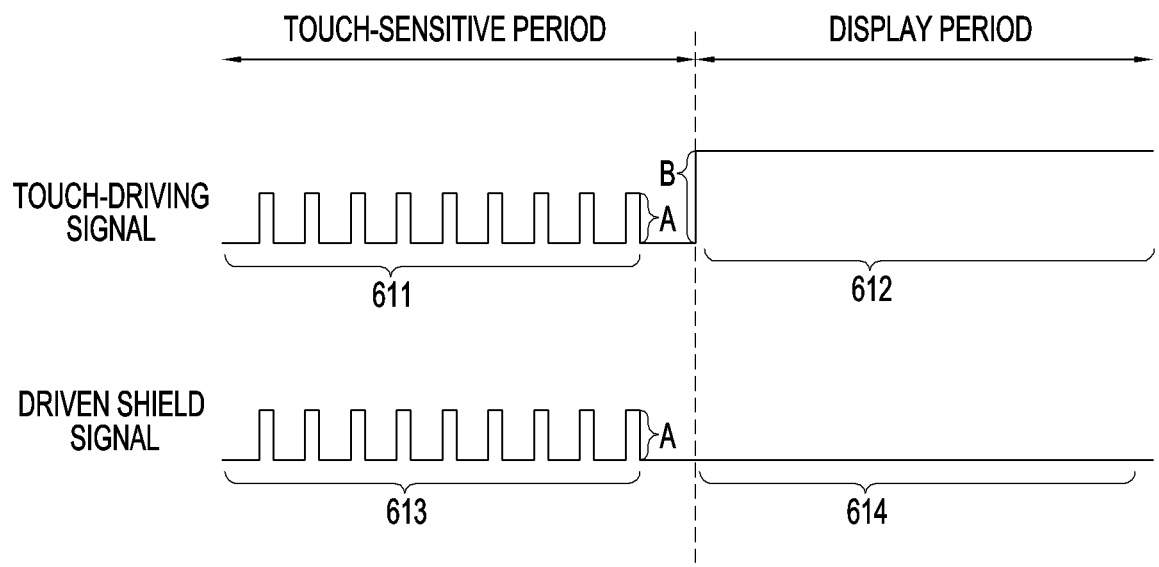
FIG. 6B illustrates a touch-driving signal and a driven shield signal, according to an embodiment.
Figure 6C:
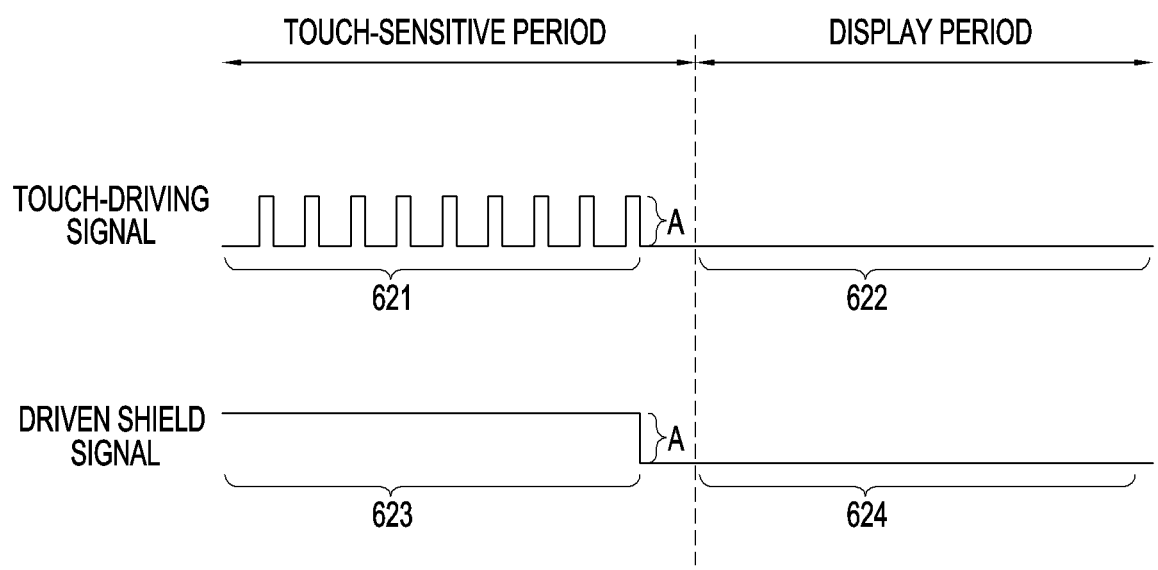
FIG. 6C illustrates a touch-driving signal and a driven shield signal, according to an embodiment.

FIG. 6A illustrates a touch-driving signal and a driven shield signal, according to an embodiment. FIG. 6B illustrates a touch-driving signal and a driven shield signal, according to an embodiment. FIG. 6C illustrates a touch-driving signal and a driven shield signal, according to an embodiment.

Referring to FIG. 6A, the electronic device 101 may apply a touch-driving signal 601 during a touch-sensitive period. The touch-driving signal 601 may have, for example, a square wave shape and an amplitude A. The electronic device 101 may perform control such that a voltage 602 of substantially 0 V is applied to the touch electrodes during the display period. The electronic device 101 may use the touch electrodes as common electrodes, or may include additional common electrodes in addition to the touch electrodes. When the electronic device 101 additionally includes common electrodes for display, the electronic device 101 may apply a common voltage to the common electrodes rather than the touch electrodes. The electronic device 101 may apply a driven shield signal 603 to the ground layer 306 disposed on the rear surface of the first substrate 301 during the touch-sensitive period. The driven shield signal 603 may have the same phase and the same amplitude as the touch-driving signal 601. During the display period, the electronic device 101 may perform control such that a ground voltage 604 (e.g., substantially 0 V) is applied to the ground layer 306.

Referring to FIG. 6B, the electronic device 101 may apply a touch-driving signal 611 during the touch-sensitive period. The touch-driving signal 611 may have, for example, a square wave shape and an amplitude A. The electronic device 101 may apply a common voltage 612 to the touch electrodes during the display period. The common voltage 612 may take a form of, for example, a constant function having an amplitude B, but may also include other forms. For example, the common voltage 612 may take a form of a square wave shape, and the amplitude may be less than or equal to the amplitude of the touch-driving signal. The electronic device 101 may apply a driven shield signal 613 to the ground layer 306 disposed on the rear surface of the first substrate 301 during the touch-sensitive period. The driven shield signal 613 may have the same phase and the same amplitude as the touch-driving signal 611. During the display period, the electronic device 101 may perform control such that a ground voltage 614 (e.g., substantially 0 V) is applied to the ground layer 306.

Referring to FIG. 6C, the electronic device 101 may apply a touch-driving signal 621 during the touch-sensitive period. The touch-driving signal 621 may have, for example, a square wave shape and an amplitude A. The electronic device 101 may perform control such that a voltage 622 of substantially 0 V is applied to the touch electrodes during the display period. In this case, the electronic device 101 may additionally include common electrodes for display in addition to the touch electrodes, and the electronic device 101 may apply a common voltage to the common electrodes. Meanwhile, as described above with reference to FIG. 6B, when the touch electrodes are used as common electrodes, the electronic device 101 may apply a common voltage to the common electrodes. The electronic device 101 may apply a driven shield signal 623 to the ground layer 306 disposed on the rear surface of the first substrate 301 during the touch-sensitive period. The driven shield signal 623 may take a form of a constant function having the same amplitude as the touch-driving signal 601. During the display period, the electronic device 101 may perform control such that a ground voltage 624 (e.g., substantially 0 V) is applied to the ground layer 306.

Figure 7A:
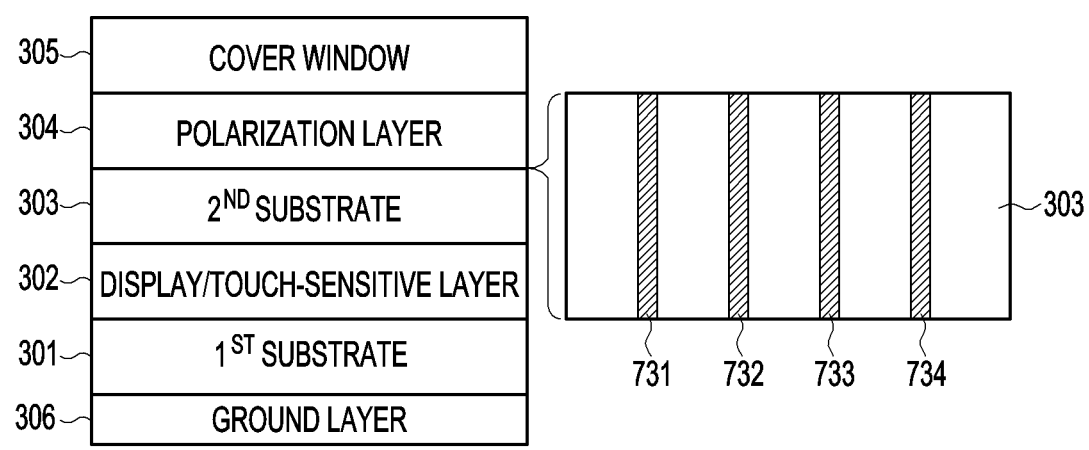
FIG. 7A is a diagram illustrating a stacked structure of a touch screen, according to an embodiment.

FIG. 7A is a diagram illustrating a stacked structure of a touch screen, according to an embodiment.

Referring to FIG. 7A, one or more blocking electrodes including a first blocking electrode 731, a second blocking electrode 732, a third blocking electrode 733, and a fourth blocking electrode 734 are disposed on the rear surface or the top surface of the second substrate 303. For example, the one or more blocking electrodes may be floating, or may be connected to the touch sensor IC 253 so as to be connected to the ground. The positions of the one or more blocking electrodes on the second substrate 303 may correspond to the positions of traces of touch electrodes on the first substrate 301.

Figure 7B:
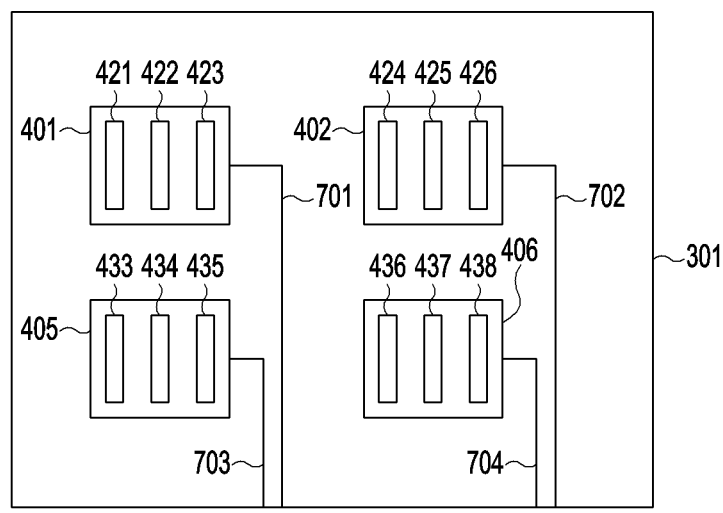
FIG. 7B illustrates plan views of the first and second substrates, according to an embodiment.
Figure 7B:
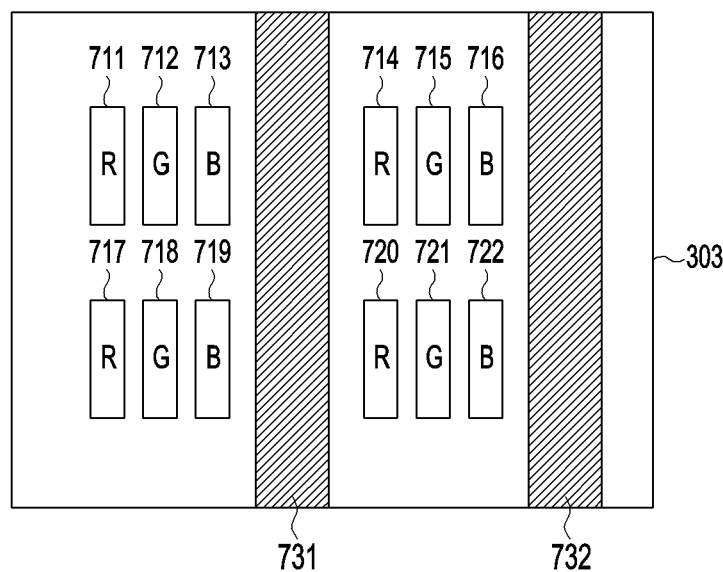

FIG. 7B illustrates plan views of the first and second substrates. For example, as illustrated in FIG. 7B, touch electrodes including the first touch electrode 401, the second touch electrode 402, the fifth touch electrode 405, and the sixth touch electrode 406 and pixel electrodes including the first pixel electrode 421, the second pixel electrode 422, the third pixel electrode 423, the fourth pixel electrode 424, the fifth pixel electrode 425, the sixth pixel electrode 426, the thirteenth pixel electrode 433, the fourteenth pixel electrode 434, the fifteenth pixel electrode 435, the sixteenth pixel electrode 436, the seventeenth pixel electrode 437, and the eighteenth pixel electrode 438 are disposed on the first substrate 301. The touch electrodes may be connected to the touch sensor IC 253 or the TDDI 490 via traces including a first trace 701, a second trace 702, a third trace 703, and a fourth trace 704. A touch-driving signal may be applied to the touch electrodes via the traces.

When the electronic device 101 is of an LCD type of device, color filters including a first color filter 711, a second color filter 712, a third color filter 713, a fourth color filter 714, a fifth color filter 715, a sixth color filter 716, a seventh color filter 717, an eighth color filter 718, a ninth color filter 719, a tenth color filter 720, a eleventh color filter 721, and a twelfth color filter 722 may be disposed on the second substrate 303. The color filters may be disposed at positions corresponding to positions of the pixel electrodes including the first pixel electrode 421, the second pixel electrode 422, the third pixel electrode 423, the fourth pixel electrode 424, the fifth pixel electrode 425, the sixth pixel electrode 426, the thirteenth pixel electrode 433, the fourteenth pixel electrode 434, the fifteenth pixel electrode 435, the sixteenth pixel electrode 436, the seventeenth pixel electrode 437, and the eighteenth pixel electrode 438 on the first substrate 301, respectively. In addition, the first blocking electrode 731 and the second blocking electrode 732 may be disposed at positions corresponding to positions of the first trace 701, the second trace 702, the third trace 703, and the fourth trace 704 on the first substrate 301, respectively. Meanwhile, when the electronic device 101 is of an OLED type of device, no color filter may be disposed on the second substrate 303, in which case, the first blocking electrode 731 and the second blocking electrode 732 may be disposed on the second substrate 303. The first blocking electrode 731 and the second blocking electrode 732 may block deterioration of sensitivity caused by the first trace 701, the second trace 702, the third trace 703, and the fourth trace 704.

Figure 8A:
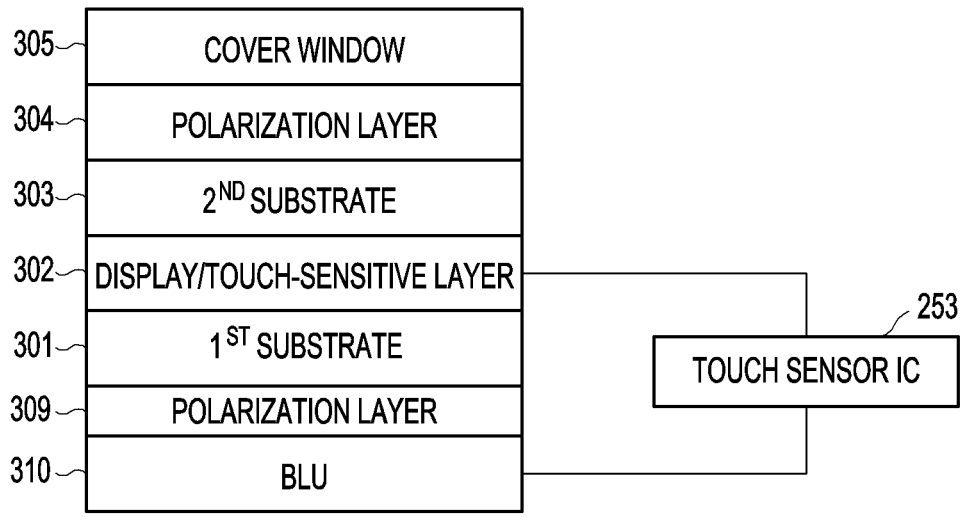
FIG. 8A is a diagram illustrating a stacked structure of a touch screen, according to an embodiment.

FIG. 8A is a diagram illustrating a stacked structure of a touch screen, according to an embodiment.

Referring to FIG. 8A, a display/touch-sensitive layer 302, a second substrate 303, a polarization layer 304, and a cover window 305 are disposed on the first substrate 301. A polarization layer 309 may be disposed on the rear surface of the first substrate 301, and a BLU 310 may be disposed under the polarization layer 309. A touch sensor IC 253 may be connected to the display/touch-sensitive layer 302 and the BLU 310. The touch sensor IC 253 may perform control such that a driven shield signal is applied to the BLU 310 during the touch-sensitive period. FIG. 8A illustrates that no ground layer 306 is disposed under the first substrate 301. However, the ground layer 306 may be disposed under the first substrate 301.

Figure 8B:
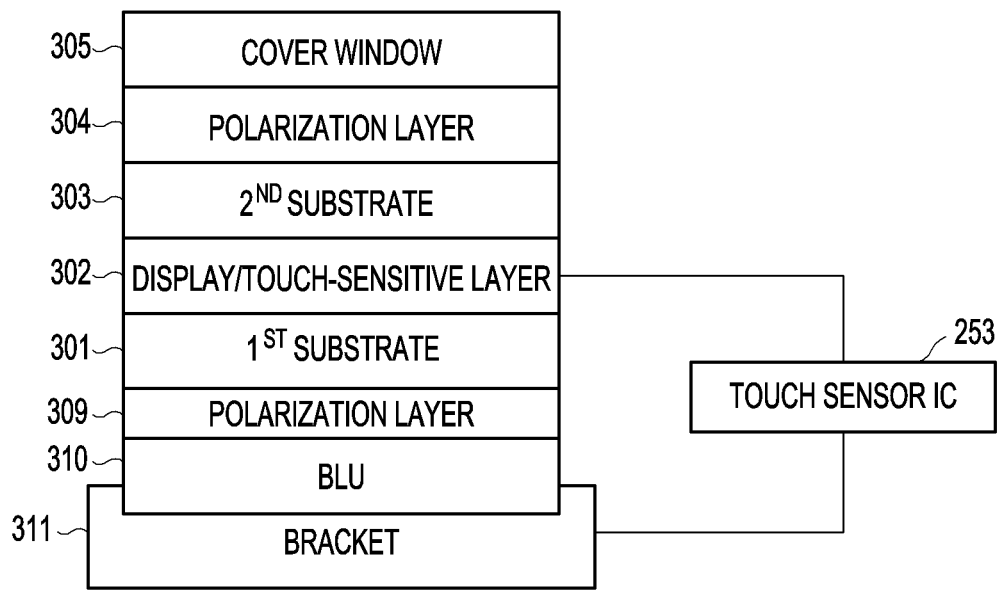
FIG. 8B is a diagram illustrating a stacked structure of a touch screen, according to an embodiment.

FIG. 8B is a diagram illustrating a stacked structure of a touch screen, according to an embodiment.

Compared to the embodiment of FIG. 8A, the BLU 310 of FIG. 8B is accommodated in a bracket 311. The touch sensor IC 253 may be connected to the display/touch-sensitive layer 302 and the bracket 311. The touch sensor IC 253 may perform control such that a driven shield signal is applied to the BLU 310 during the touch-sensitive period. FIG. 8A illustrates that no ground layer 306 is disposed under the first substrate 301. However, the ground layer 306 may be disposed under the first substrate 301. The bracket 311 may also be constructed of an SUS material. FIGS. 8A and 8B illustrate that the BLU or the bracket in the in-cell structure is as an object to which a driven shield signal is to be applied. However, this is merely an example, and the BLU or bracket in the on-cell structure may also be implemented as an object to which the driven shield signal is to be applied.

Figure 9A:
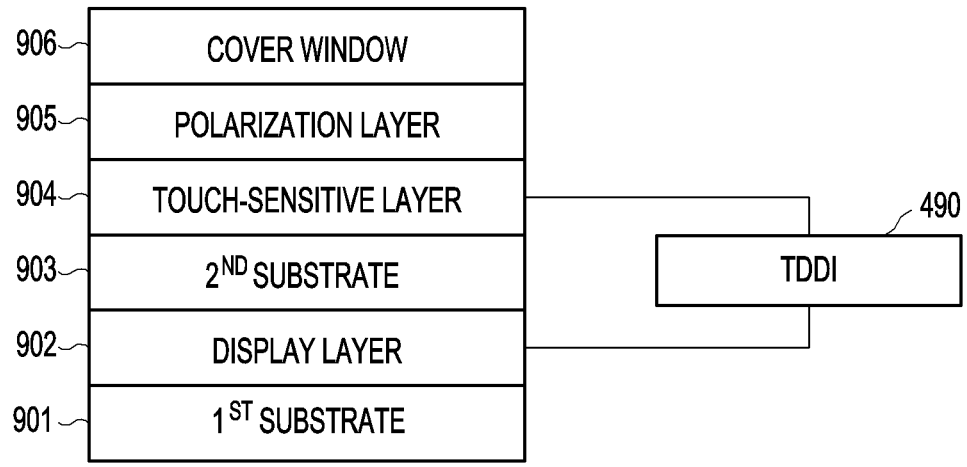
FIG. 9A illustrates a stacked structure and an electrical connection relationship of an on-cell type touch screen in which a touch-sensitive layer is disposed on an upper glass plate, according to an embodiment.

FIG. 9A illustrates a stacked structure and an electrical connection relationship of an on-cell type touch screen in which a touch-sensitive layer is disposed on an upper glass plate, according to an embodiment.

Referring to FIG. 9A, a display layer 902 is disposed on a first surface of a first substrate 901. The first substrate 901 and the second substrate 903 may be made of glass or a polymer, but are not limited to these materials. For example, a signal line (e.g., a gate line or a data line) to which a display-driving signal (e.g., a gate signal or a data signal) is applied may be disposed on the display layer 902. The display layer 902 may include a plurality of TFTs, each of which is connected to the signal line and each of a plurality of pixel electrodes. The display layer 902 may include a common electrode (or a common voltage line) for applying a common voltage to one end of a capacitor connected to each pixel electrode. The display layer 902 may include liquid crystals having orientation, which is changed by an electrical signal applied to the pixel electrodes.

The second substrate 903 may be disposed on the display layer 902, and may be disposed on, for example, a liquid crystal layer. When the electronic device 101 is an LCD type of device, color filters may be disposed on the second substrate 903. When the electronic device 101 is an OLED type of device, no color filter may be disposed on the second substrate 903, and the display layer 902 may include OLEDs. For example, the OLEDs may be connected to the TFTs.

A touch-sensitive layer 904 may be disposed on the second substrate 903. A plurality of touch electrodes may be disposed on the touch-sensitive layer 904. A polarization layer 905 may be disposed on the touch-sensitive layer 904, and a cover window 906 may be disposed on the polarization layer 905.

During the touch-sensitive period, the TDDI 490 may apply a touch-driving signal to the touch-sensitive layer 904. The TDDI 490 may apply a common voltage to a common electrode (e.g., a common voltage line) of the display layer 902 during the display period. The TDDI 490 may perform control such that a voltage of substantially 0 V is applied to the touch-sensitive layer 904 during the display period. The TDDI 490 may apply a driven shield signal to a common electrode (e.g., a common voltage line) of the display layer 902 during the touch-sensitive period. In addition, the TDDI 490 may display an image by performing control such that a signal is applied to the gate line and the data line during the display period.

Figure 9B:
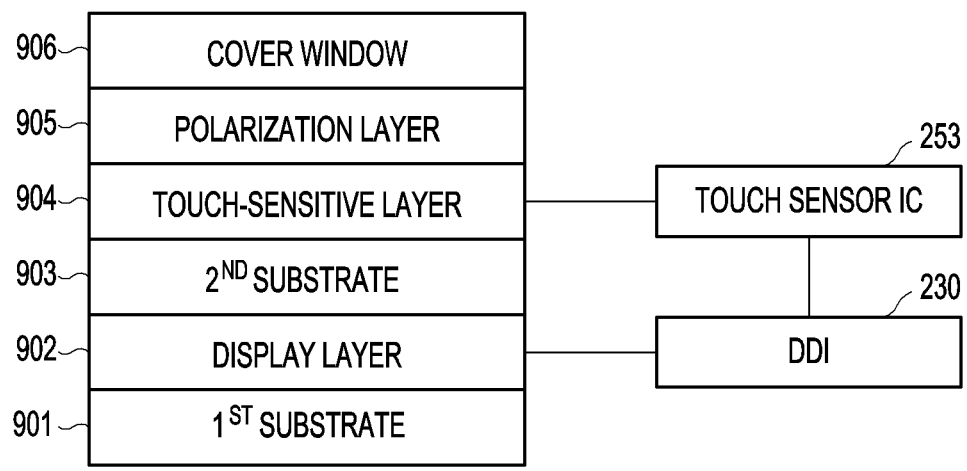
FIG. 9B illustrates a stacked structure and an electrical connection relationship of an on-cell type touch screen in which a touch-sensitive layer is disposed on a top glass plate, according to an embodiment.

Referring to FIG. 9B, the electronic device 101 includes a touch sensor IC 253 and a DDI 230 instead of the TDDI 490. The touch sensor IC 253 may be connected to the touch-sensitive layer, and the DDI 230 may be connected to the display layer 902. The touch sensor IC 253 may identify the touch-sensitive period and the displaying period based on a synchronization signal from the DDI 230. The DDI 230 may identify the touch-sensitive period and the displaying period based on, for example, a signal from a timing controller. The touch sensor IC 253 may directly receive a signal from the timing controller and may identify the touch-sensitive period and the display period. The touch sensor IC 253 may apply a touch-driving signal to the touch electrodes of the touch-sensitive layer 904 during the touch-sensitive period. The touch sensor IC 253 may perform control such that a voltage of substantially 0 V is applied to the touch electrodes during the display period. The DDI 230 may apply a common voltage to a common electrode (e.g., a common voltage line) of the display layer 902 during the display period. The DDI 230 may apply a driven shield signal to the common electrode during the touch-sensitive period.

Figure 10A:
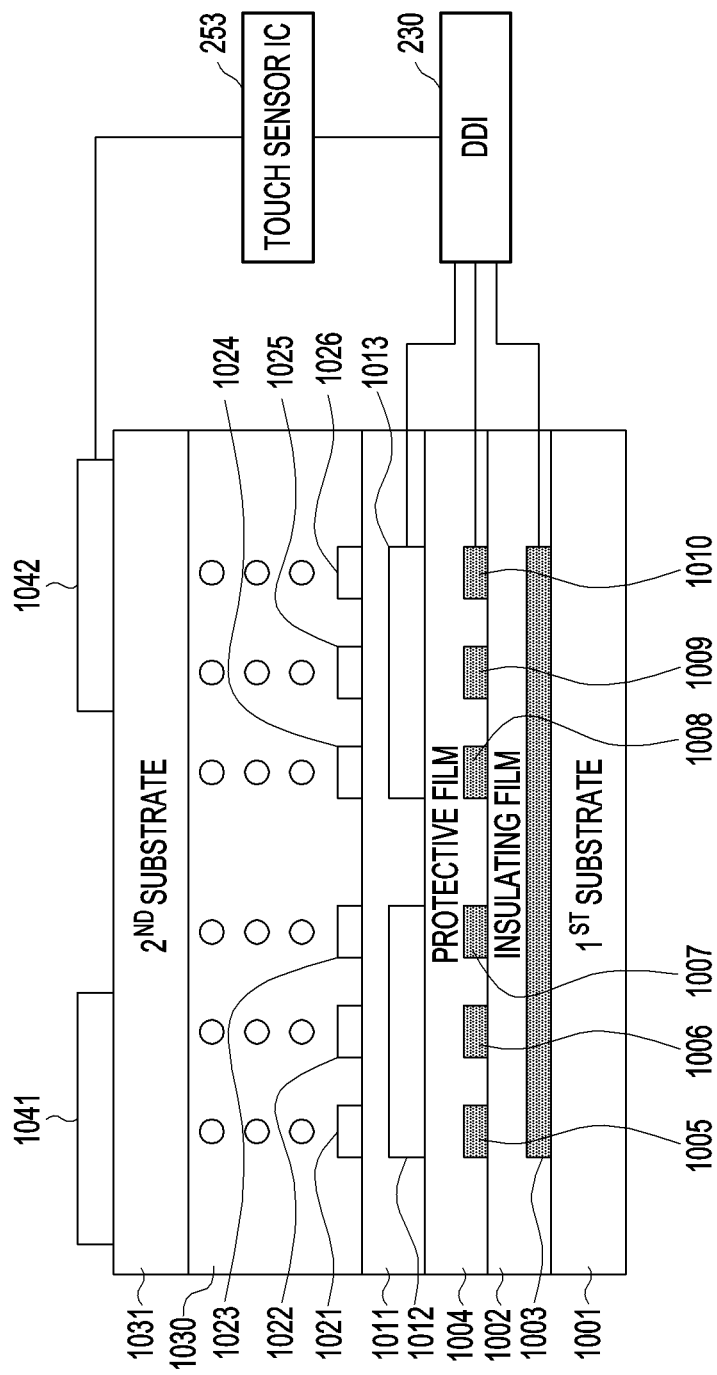
FIG. 10A is a diagram illustrating a stacked structure of a touch screen, according to an embodiment.

FIG. 10A is a diagram illustrating a stacked structure of a touch screen, according to an embodiment.

Referring to FIG. 10A, a gate line 1003 is disposed on a first substrate 1001, and the gate line 1003 may be covered by an insulating film 1002. Data lines including a first data line 1005, a second data line 1006, a third data line 1007, a fourth data line 1008, a fifth data line 1009, and a sixth data line 1010 may be disposed on the insulating film 1002 and may be covered by a protective film 1004. A first common electrode 1012 and a second common electrode 1013 may be disposed on the protective film 1004. The first common electrode 1012 and the second common electrode 1013 may be covered by an insulating film 1011, and pixel electrodes including a first pixel electrode 1021, a second pixel electrode 1022, a third pixel electrode 1023, a fourth pixel electrode 1024, a fifth pixel electrode 1025, and a sixth pixel electrode 1026 may be disposed on the insulating film 1011.

A common voltage, applied via the first common electrode 1012 and the second common electrode 1013, may be applied to one end of a capacitor connected to each of the pixel electrodes.

A liquid crystal layer 1030 may be disposed on the pixel electrodes including the first pixel electrode 1021, the second pixel electrode 1022, the third pixel electrode 1023, the fourth pixel electrode 1024, the fifth pixel electrode 1025, and the sixth pixel electrode 1026, and a second substrate 1031 may be disposed on the liquid crystal layer 1030. A first touch electrode 1041 and a second touch electrode 1042 may be disposed on the second substrate 1031. The touch sensor IC 252 may be connected to the first touch electrode 1041 and the second touch electrode 1042. The touch sensor IC 252 may apply a touch-driving signal to the first touch electrode 1041 and the second touch electrode 1042 during the touch-sensitive period, and may identify touch information including a touch position based on the degree of capacitance change of the first touch electrode 1041 and the second touch electrode 1042. The DDI 230 may apply a common voltage to the common first common electrode 1012 and the second common electrode 1013 during the display period. The DDI 230 may apply a driven shield signal to the first common electrode 1012 and the second common electrode 1013 during the touch-sensitive period. As described above, the touch sensor IC 253 and the DDI 230 may be implemented as a TDDI, which is a single IC.

Figure 10B:
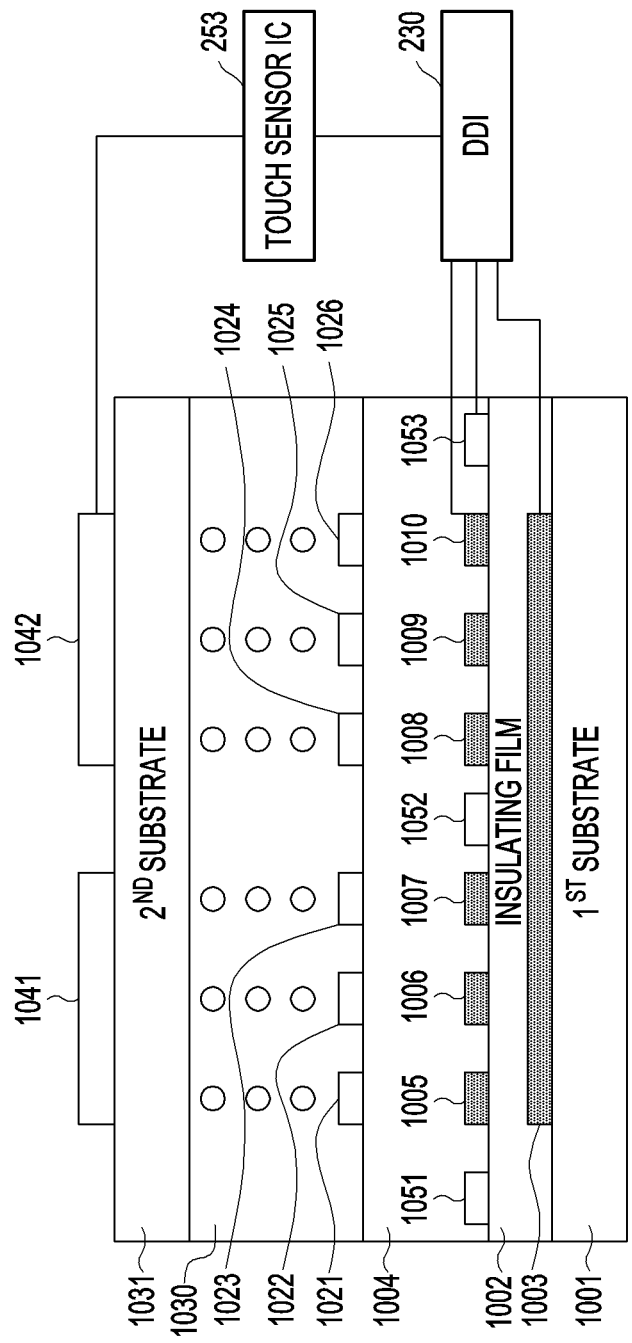
FIG. 10B is a diagram illustrating a stacked structure of a touch screen, according to an embodiment.

FIG. 10B is a diagram illustrating a stacked structure of a touch screen, according to an embodiment.

Referring to FIG. 10B, the common electrodes (or the common voltage lines) including a first common electrode 1051, a second common electrode 1052, and a third common electrode 1053 may be disposed on the same plane as the data lines including a first data line 1005, a second data line 1006, a third data line 1007, a fourth data line 1008, a fifth data line 1009, and a sixth data line 1010. Alternatively, the common electrodes may be disposed on the same plane as the pixel electrodes including a first pixel electrode 1021, a second pixel electrode 1022, a third pixel electrode 1023, a fourth pixel electrode 1024, a fifth pixel electrode 1025, and a sixth pixel electrode 1026. It may be readily understood by a person ordinarily skilled in the art that the common electrodes may be disposed under the second substrate 1031 and the position and shape of the common electrodes may vary.

Figure 11:
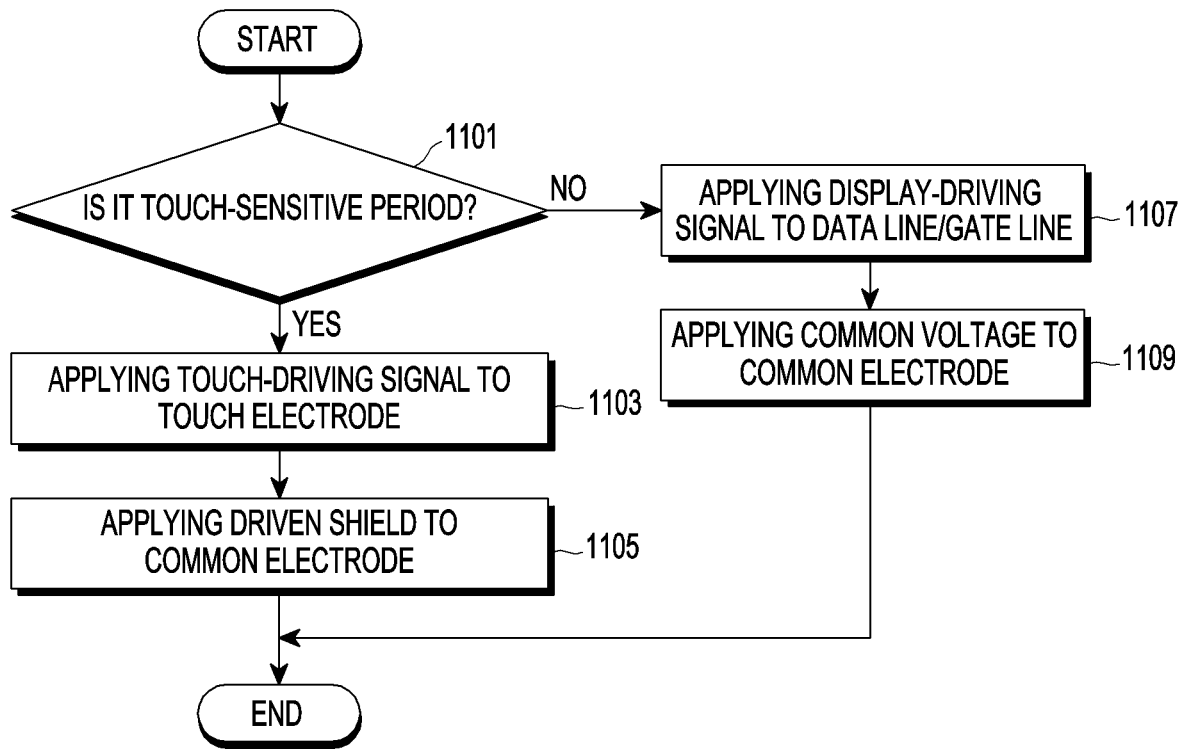
FIG. 11 is a flowchart illustrating a method of operating an electronic device, according to an embodiment.

FIG. 11 is a flowchart illustrating a method of operating an electronic device, according to an embodiment.

Referring to FIG. 11, in step 1101, the electronic device 101 identifies whether a display period is a touch-sensitive period. For example, the touch sensor IC 253 may identify whether the display period is a touch-sensitive period based on a synchronization signal from the DDI 230 or a signal from the timing controller. The touch-sensitive period and the display period may be synchronized. The DDI 230 may identify whether the display period is the touch-sensitive period based on, for example, a signal from the timing controller.

During the touch-sensitive period, in step 1103, the electronic device 101 applies a touch-driving signal to the touch electrodes. In step 1105, the electronic device 101 applies a driven shield signal to the common electrodes of the display layer. The driven shield signal may have the same phase and the same amplitude as the touch-driving signal. Alternatively, the driven shield signal may be implemented in the form of a constant function having the same amplitude as the touch-driving signal.

During the display period, in step 1107, the electronic device 101 applies a display-driving signal to the data lines and the gate lines. In step 1109, the electronic device 101 applies a common voltage to the common electrodes. For example, the electronic device 101 may perform control such that a voltage of substantially 0 V is applied to the touch electrodes during the display period.

Figure 12:
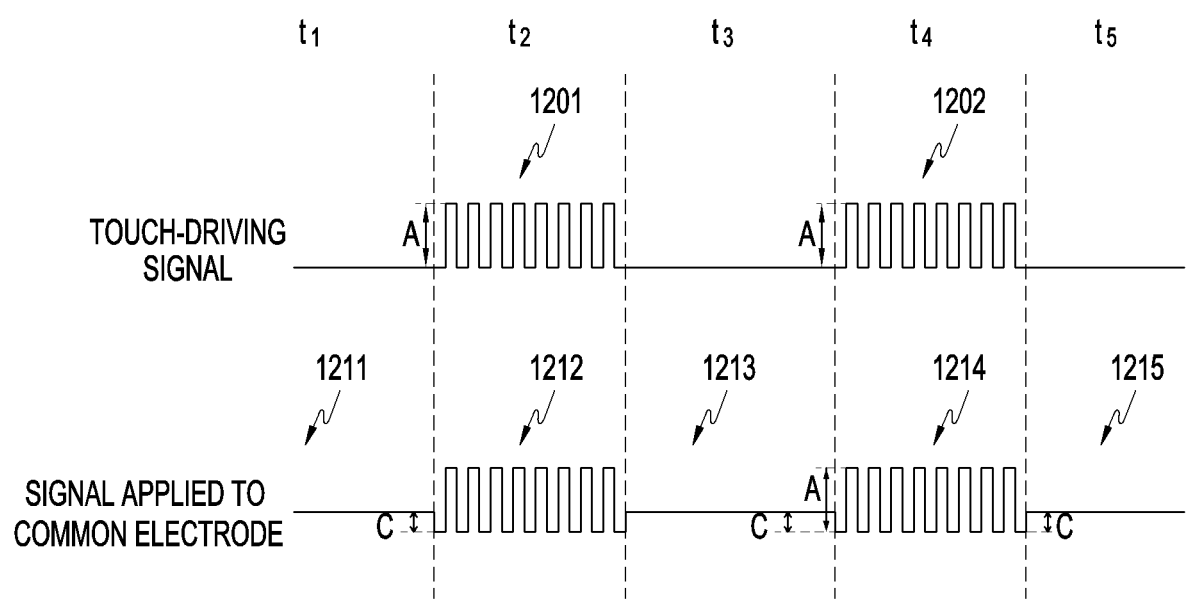
FIG. 12 illustrates a touch-driving signal and a signal applied to a common electrode, according to an embodiment.

FIG. 12 illustrates a touch-driving signal and a signal applied to a common electrode, according to an embodiment.

Referring to FIG. 12, a first time period t1, a third time period t3, and a fifth time period t5 are ordinary time periods, and a second time period t2 and a fourth time period t4 are touch-sensitive time periods. During the touch-sensitive time periods, the electronic device 101 may apply a first touch-driving signal 1201 and a second touch-driving signal 1202 to the touch electrodes. During the touch-sensitive periods, the electronic device 101 may apply a first driven shield signal 1212 and a second driven shield signal 1214 to the common electrodes. For example, the first driven shield signal 1212 and the second driven shield signal 1214 may have the same phase and the same amplitude as the first touch-driving signal 1201 and the second touch-driving signal 1202. The first driven shield signal 1212 and the second driven shield signal 1214 may take a form of a constant function having the same amplitude as the first touch-driving signal 1201 and the second touch-driving signal 1202.

During the display periods, the electronic device 101 may perform control such that a voltage of substantially 0 V is applied to the touch electrodes. During the display periods, the electronic device 101 may apply a first common voltage 1211, a second common voltage 1213, and a third common voltage 1215 to the common electrodes. The first common voltage 1211, the second common voltage 1213, and the third common voltage 1215 are illustrated as taking, for example, the form of a constant function with an amplitude C. However, the amplitude may be greater than or equal to the amplitude of the first touch-driving signal 1201 and the second touch-driving signal 1202. Alternatively, the waveforms of the first common voltage 1211, the second common voltage 1213, and the third common voltage 1215 may be implemented in various forms such as a square wave, in addition to the form of a constant function. During the display period, various signals for displaying an image may be applied to the data lines or the gate lines.

Figure 13A:
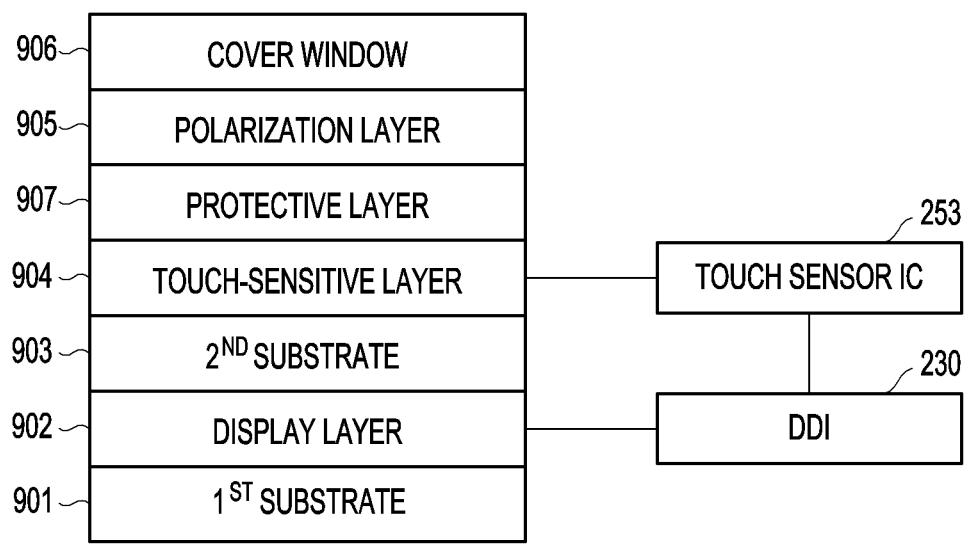
FIG. 13A is a diagram illustrating a stacked structure of a touch screen, according to an embodiment.
Figure 13B:
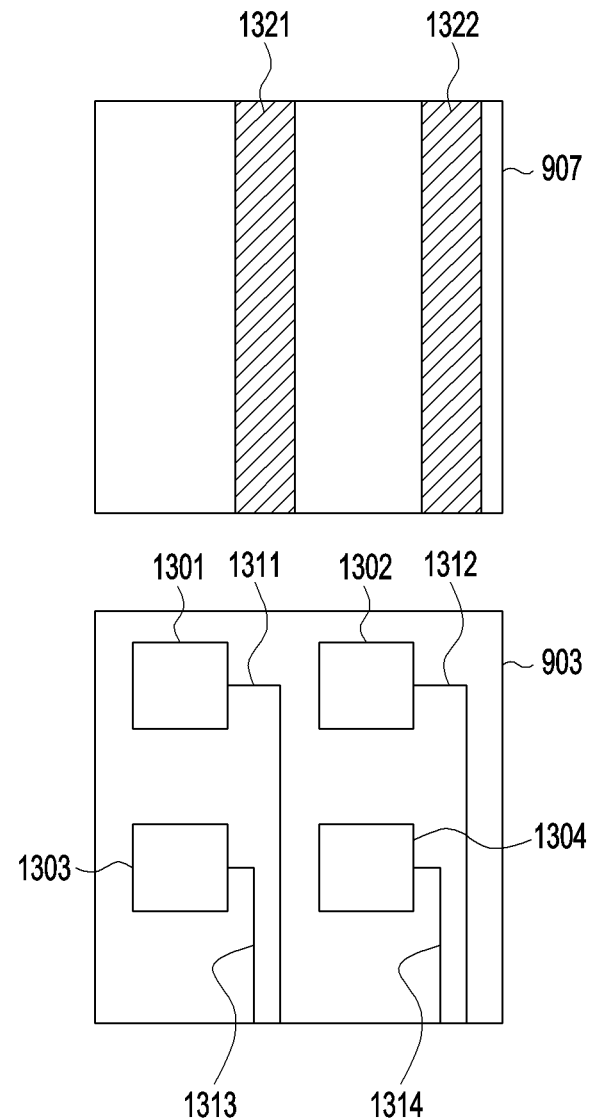
FIG. 13B illustrates plan views of a top glass plate and a protective layer, according to an embodiment.

FIG. 13A is a diagram illustrating a stacked structure of a touch screen, according to an embodiment. FIG. 13B illustrates plan views of a top glass plate and a protective layer, according to an embodiment. Some of the components of FIG. 13A may be further described with reference to FIG. 13B.

Referring to FIG. 13A, a display layer 902, a second substrate 903, and a touch-sensitive layer 904 are disposed on the first substrate 901. A protective layer 907 may be disposed on the touch-sensitive layer 904. For example, referring to FIG. 13B, in the protective layer 907, a first shield electrode 1321 and a second shield electrode 1322 may be disposed at positions covering traces including a first trace 1311, a second trace 1312, a third trace 1313, and a fourth trace 1314 which connect respective touch electrodes including a first touch electrode 1301, a second touch electrode 1302, a third touch electrode 1303, and a fourth touch electrode 1304 disposed on the second substrate 903 to an IC.

The first shield electrode 1321 and the second shield electrode 1322 may be disposed on the rear surface of a cover window 906. In this case, the protective layer 907 may not be included in the touch screen.

According to an embodiment, an electronic device may include a first substrate; a plurality of TFTs disposed on the first substrate and a plurality of pixel electrodes connected to the plurality of TFTs, respectively; a second substrate disposed above the first substrate; a plurality of touch electrodes disposed between the first substrate and the second substrate and configured to detect a touch position; a ground layer disposed under the first substrate; and at least one IC. The at least one IC may be configured to apply a touch-driving signal to each of the plurality of touch electrodes during a touch-sensitive period, and apply a driven shield signal having the same amplitude as the touch-driving signal to the ground layer during the touch-sensitive period.

The at least one IC may be configured to apply a ground voltage to the ground layer during a display period.

The at least one IC may be configured to apply a plurality of signals for displaying an image through a plurality of gate lines and a plurality of data lines connected to the plurality of TFTs during a display period.

The at least one IC may be configured to apply a common voltage corresponding to the plurality of pixel electrodes to the plurality of touch electrodes for displaying the image during the display period.

The at least one IC may be configured to maintain a voltage to the plurality of touch electrodes substantially at 0 V during the display period.

The driven shield signal may be a signal having the same amplitude and a same phase as the touch-driving signal, or a signal having a form of a constant function having the same amplitude as the touch-driving signal.

The at least one IC may include a touch sensor IC and a display-driving IC, or may be a TDDI.

When the at least one IC includes the touch sensor IC and the display-driving IC, the touch sensor IC may be configured to identify the touch-sensitive period based on information received from at least one of the display-driving IC or a timing controller.

The electronic device may further include a plurality of traces electrically connecting each of the plurality of touch electrodes to the at least one IC; and at least one blocking electrode disposed on the second substrate to cover at least some of the plurality of traces when viewed from above.

The electronic device may further include a liquid crystal layer disposed between the first substrate and the second substrate, and a BLU disposed under the first substrate to emit light. A plurality of color filters may be disposed on the second substrate at positions corresponding to positions of the plurality of pixel electrodes when viewed from above.

Each of the plurality of pixel electrodes may include an OLED.

According to an embodiment, an electronic device may include a first substrate and a display layer disposed on the first substrate. The display layer may include a plurality of TFTs, a plurality of pixel electrodes connected to the plurality of TFTs, respectively, and a plurality of common electrodes configured to apply a corresponding common voltage to each of the plurality of pixel electrodes. The electronic device may include a second substrate disposed on the display layer, a plurality of touch electrodes disposed on the second substrate for detecting a touch position, and at least one IC. The at least one IC may be configured to apply a touch-driving signal to each of the plurality of touch electrodes during a touch-sensitive period, and apply a driven shield signal having the same amplitude as the touch-driving signal to at least some of the plurality of common electrodes on the first substrate during the touch-sensitive period.

The at least one IC may be configured to apply a plurality of signals for displaying an image through a plurality of gate lines and a plurality of data lines connected to the plurality of TFTs during a display period.

The at least one IC may be configured to apply a common voltage corresponding to the plurality of pixel electrodes to the plurality of common electrodes for displaying the image during the display period.

The at least one IC may be configured to maintain a voltage to the plurality of touch electrodes substantially at 0 V during the display period.

The driven shield signal may be a signal having the same amplitude and a same phase as the touch-driving signal, or a signal having a form of a constant function having the same amplitude as the touch-driving signal.

The at least one IC may include a touch sensor IC and a display-driving IC, or may be a TDDI.

When the at least one IC includes the touch sensor IC and the display-driving IC, the touch sensor IC may be configured to identify the touch-sensitive period based on information received from at least one of the display-driving IC or a timing controller.

The electronic device may further include a plurality of traces electrically connecting each of the plurality of touch electrodes to the at least one IC, and at least one protective layer including at least one blocking electrode covering at least some of the plurality of traces when viewed from above.

According to an embodiment, an electronic device may include a first substrate; a second substrate; a display layer disposed between the first substrate and the second substrate; a plurality of touch electrodes disposed between the first substrate and the second substrate or on the second substrate; a BLU disposed under the first substrate and configured to emit light; and at least one IC. The at least one IC may be configured to apply a touch-driving signal to each of the plurality of touch electrodes during a touch-sensitive period, and apply a driven shield signal having a same amplitude as the touch-driving signal to the BLU during the touch-sensitive period.

According to an embodiment, an electronic device may include a first substrate; a second substrate; a display layer disposed between the first substrate and the second substrate; a plurality of touch electrodes disposed between the first substrate and the second substrate or on the second substrate; a BLU disposed under the first substrate and configured to emit light; a bracket configured to accommodate at least a portion of the BLU; and at least one IC. The at least one IC may be configured to apply a touch-driving signal to each of the plurality of touch electrodes during a touch-sensitive period, and apply a driven shield signal having a same amplitude as the touch-driving signal to the bracket during the touch-sensitive period.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., a program) including one or more instructions that are stored in a storage medium (e.g., internal memory or external memory) that is readable by a machine (e.g., a master device or a task performing device). For example, a processor of a machine (e.g., a master device or a task performing device) may invoke and execute at least one of the one or more instructions stored in the storage medium. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. An electronic device comprising:
a first substrate;
a plurality of thin film transistors (TFTs) disposed on the first substrate and a plurality of pixel electrodes connected to the plurality of TFTs, respectively;
a second substrate disposed above the first substrate;
a plurality of touch electrodes disposed between the first substrate and the second substrate and configured to detect a touch position;
a ground layer disposed under the first substrate; and
at least one integrated circuit (IC) configured to:
apply a touch-driving signal to each of the plurality of touch electrodes during a touch-sensitive period, and
apply a driven shield signal having an amplitude equal to an amplitude of the touch-driving signal to the ground layer during the touch-sensitive period,
wherein the at least one IC is further configured to apply a ground voltage to the ground layer during a display period,
wherein the at least one IC includes a touch sensor IC and a display-driving IC, and
wherein the touch sensor IC is configured to identify the touch-sensitive period based on information received from at least one of the display-driving IC or a timing controller.

2. The electronic device of claim 1, wherein the at least one IC is further configured to apply a plurality of signals for displaying an image through a plurality of gate lines and a plurality of data lines connected to the plurality of TFTs during a display period.

3. The electronic device of claim 2, wherein the at least one IC is further configured to apply a common voltage corresponding to the plurality of pixel electrodes to the plurality of touch electrodes for displaying the image during the display period.

4. The electronic device of claim 2, wherein the at least one IC is further configured to maintain a voltage applied to the plurality of touch electrodes substantially at 0 volts (V) during the display period.

5. The electronic device of claim 1, wherein the driven shield signal has a phase that is equal to a phase of the touch-driving signal and has the amplitude of the touch-driving signal, or a signal having a form of a constant function having the amplitude as the touch-driving signal.

6. The electronic device of claim 1, further comprising:
a plurality of traces electrically connecting each of the plurality of touch electrodes to the at least one IC; and
at least one blocking electrode disposed on the second substrate to cover at least some of the plurality of traces when viewed from above.

7. The electronic device of claim 1, further comprising:
a liquid crystal layer disposed between the first substrate and the second substrate; and
a back light unit (BLU) disposed under the first substrate to emit light,
wherein a plurality of color filters are disposed on the second substrate at positions corresponding to positions of the plurality of pixel electrodes when viewed from above.

8. The electronic device of claim 1, wherein each of the plurality of pixel electrodes includes an organic light emitting diode (OLED).

9. An electronic device comprising:
a first substrate;
a display layer disposed on the first substrate, wherein the display layer includes a plurality of thin film transistors (TFTs), a plurality of pixel electrodes connected to the plurality of TFTs, respectively, and a plurality of common electrodes configured to apply a corresponding common voltage to each the plurality of pixel electrodes;
a second substrate disposed on the display layer;
a plurality of touch electrodes disposed on the second substrate for detecting a touch position; and
at least one integrated circuit (IC) configured to:
apply a touch-driving signal to each of the plurality of touch electrodes during a touch-sensitive period, and
apply a driven shield signal having an amplitude equal to an amplitude of the touch-driving signal to at least some of the plurality of common electrodes on the first substrate during the touch-sensitive period,
wherein the at least one IC includes a touch sensor IC and a display-driving IC, and the touch sensor IC is configured to identify the touch-sensitive period based on information received from at least one of the display-driving IC or a timing controller.

10. The electronic device of claim 9, wherein the at least one IC is further configured to apply a plurality of signals for displaying an image through a plurality of gate lines and a plurality of data lines connected to the plurality of TFTs during a display period.

11. The electronic device of claim 10, wherein the at least one IC is further configured to apply a common voltage corresponding to the plurality of pixel electrodes to the plurality of common electrodes for displaying the image during the display period.

12. The electronic device of claim 9, wherein the at least one IC is further configured to maintain a voltage applied to the plurality of touch electrodes substantially at 0 volts (V) during the display period.

13. The electronic device of claim 9, wherein the driven shield signal has a phase that is equal to a phase of the touch-driving signal and has the amplitude of the touch-driving signal, or a signal having a form of a constant function having the amplitude as the touch-driving signal.

14. The electronic device of claim 9, wherein the at least one IC includes a touch sensor IC and a display-driving IC, or is a touch-and-display driver IC (TDDI).

15. An electronic device comprising:
a first substrate;
a display layer disposed on the first substrate, wherein the display layer includes a plurality of thin film transistors (TFTs), a plurality of pixel electrodes connected to the plurality of TFTs, respectively, and a plurality of common electrodes configured to apply a corresponding common voltage to each the plurality of pixel electrodes;
a second substrate disposed on the display layer;
a plurality of touch electrodes disposed on the second substrate for detecting a touch position;
a plurality of traces electrically connecting each of the plurality of touch electrodes to at least one integrated circuit (IC); and
a protective layer including at least one blocking electrode covering at least some of the plurality of traces when viewed from above,
wherein the at least one IC is configured to:
apply a touch-driving signal to each of the plurality of touch electrodes during a touch-sensitive period, and
apply a driven shield signal having an amplitude equal to an amplitude of the touch-driving signal to at least some of the plurality of common electrodes on the first substrate during the touch-sensitive period.

16. An electronic device comprising:
a first substrate;
a second substrate;
a display layer disposed between the first substrate and the second substrate;
a plurality of touch electrodes disposed between the first substrate and the second substrate or on the second substrate;
a back light unit (BLU) disposed under the first substrate and configured to emit light; and
at least one integrated circuit (IC) configured to:
apply a touch-driving signal to each of the plurality of touch electrodes during a touch-sensitive period, and
apply a driven shield signal having an amplitude that is equal to an amplitude of the touch-driving signal to the BLU during the touch-sensitive period.

17. An electronic device comprising:
a first substrate;
a second substrate;
a display layer disposed between the first substrate and the second substrate;
a plurality of touch electrodes disposed between the first substrate and the second substrate or on the second substrate;
a back light unit (BLU) disposed under the first substrate and configured to emit light;
a bracket configured to accommodate at least a portion of the BLU; and
at least one integrated circuit (IC) configured to:
apply a touch-driving signal to each of the plurality of touch electrodes during a touch-sensitive period, and
apply a driven shield signal having an amplitude that is equal to an amplitude of the touch-driving signal to the bracket during the touch-sensitive period.

* * * * *